(12) United States Patent
Sun

(10) Patent No.: US 11,674,994 B2
(45) Date of Patent: Jun. 13, 2023

(54) DISTRIBUTION FAULT LOCATION USING GRAPH NEURAL NETWORK WITH BOTH NODE AND LINK ATTRIBUTES

(71) Applicant: Mitsubishi Electric Research Laboratories,Inc., Cambridge, MA (US)

(72) Inventor: Hongbo Sun, Lexington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 127 days.

(21) Appl. No.: 17/183,636

(22) Filed: Feb. 24, 2021

(65) Prior Publication Data
US 2022/0268827 A1    Aug. 25, 2022

(51) Int. Cl.
*G01R 31/08* (2020.01)
*G01R 31/52* (2020.01)
(Continued)

(52) U.S. Cl.
CPC ........... *G01R 31/088* (2013.01); *G01R 31/52* (2020.01); *G01R 31/58* (2020.01); *H02H 1/0092* (2013.01);
(Continued)

(58) Field of Classification Search
CPC ...... G01R 31/58; G01R 31/52; G01R 31/088; H02H 1/0092; H02H 3/021; H02H 3/16; H02H 3/162; H02H 7/008
See application file for complete search history.

(56) References Cited

U.S. PATENT DOCUMENTS 5,724,247 A    3/1998 Dalstein
8,751,421 B2    6/2014 Anderson et al.
(Continued)

FOREIGN PATENT DOCUMENTS

CN    105930919    9/2016
CN    106169102    11/2016
(Continued)

OTHER PUBLICATIONS

Chen et al. "Fault Location in Power Distribution Systems via Deep Graph Convolutional Networks" IEEE Journal on Selected Areas in Communications (vol. 38, Issue: 1, pp. 119-131). (Year: 2019).*
(Continued)

*Primary Examiner* — Giovanni Astacio-Oquendo
*Assistant Examiner* — Dilara Sultana
(74) *Attorney, Agent, or Firm* — Gennadiy Vinokur; Hironori Tsukamoto

(57) ABSTRACT

Systems and methods performed by a fault detection apparatus for fault detection and localization in distribution feeders having branches and nodes. The method including receive feeder raw data in a feeder of a power system. Process the feeder raw data with given operational electrical characteristics of the feeder to generate a branch attribute dataset for each branch separated by a pair of nodes for all branches. Generate a node attribute dataset for each node for all the nodes in the feeder. Input the branch and node attribute datasets into a trained neural network to determine whether a branch has a fault and a fault location within the branch, to output a classification of the fault and the fault location. Generate an alert signal based upon determining the classified fault and fault location in response to the alert signal to an outage response system.

23 Claims, 17 Drawing Sheets

(51) Int. Cl.
    *G01R 31/58*      (2020.01)
    *H02H 1/00*      (2006.01)
    *H02H 3/02*      (2006.01)
    *H02H 3/16*      (2006.01)
    *H02H 7/00*      (2006.01)

(52) U.S. Cl.
    CPC .............. *H02H 3/021* (2013.01); *H02H 3/16* (2013.01); *H02H 3/162* (2013.01); *H02H 7/008* (2013.01)

(56) References Cited

U.S. PATENT DOCUMENTS

| | | |
|---|---|---|
| 10,324,132 B2 | 6/2019 | Saarinen et al. |
| 10,657,306 B1 * | 5/2020 | Ma ........................ G06F 30/327 |
| 2020/0195007 A1 * | 6/2020 | Sun ........................ H04L 45/02 |
| 2020/0292608 A1 * | 9/2020 | Yan .................... G05B 23/0254 |
| 2020/0326363 A1 * | 10/2020 | Sun ..................... H02H 1/0092 |

FOREIGN PATENT DOCUMENTS

| | | | |
|---|---|---|---|
| CN | 109256792 | 1/2019 | |
| CN | 110133447 | 8/2019 | |
| CN | 111965476 A * | 11/2020 | ........... G01R 19/165 |

OTHER PUBLICATIONS

N. Sapountzoglou, et al. "A generalizable and sensor-independent deep learning method for fault detection and location in low-voltage distribution grids, Applied Energy, 276 (2020) 115299". (Year: 2020).*

* cited by examiner

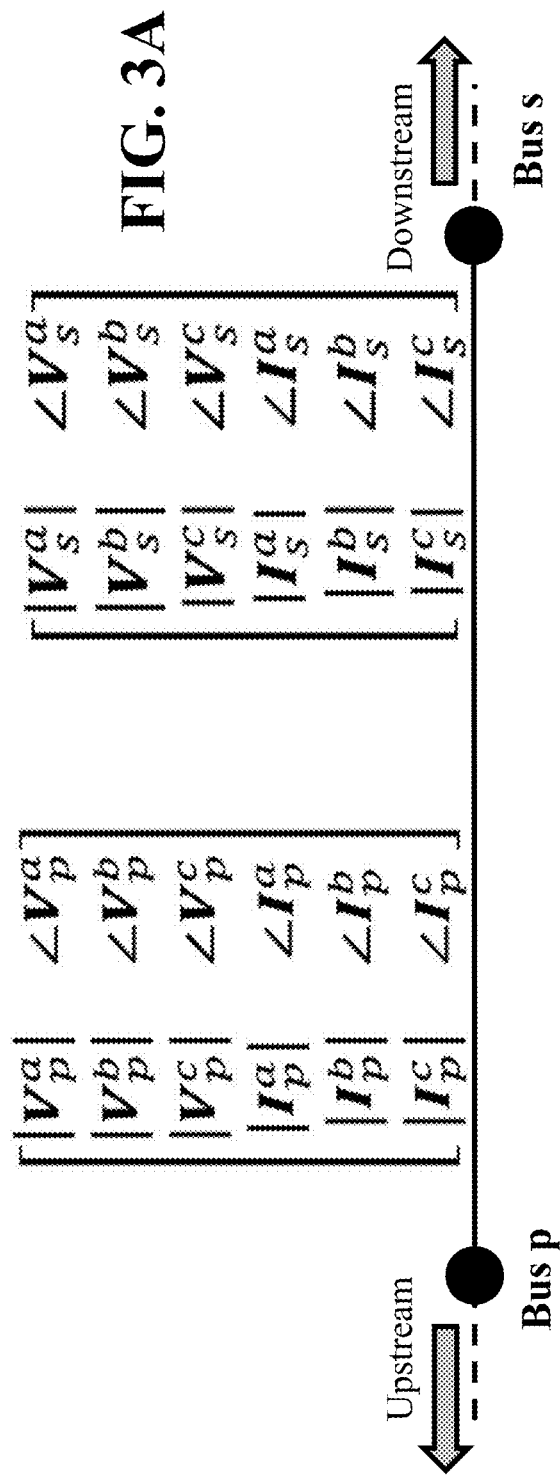
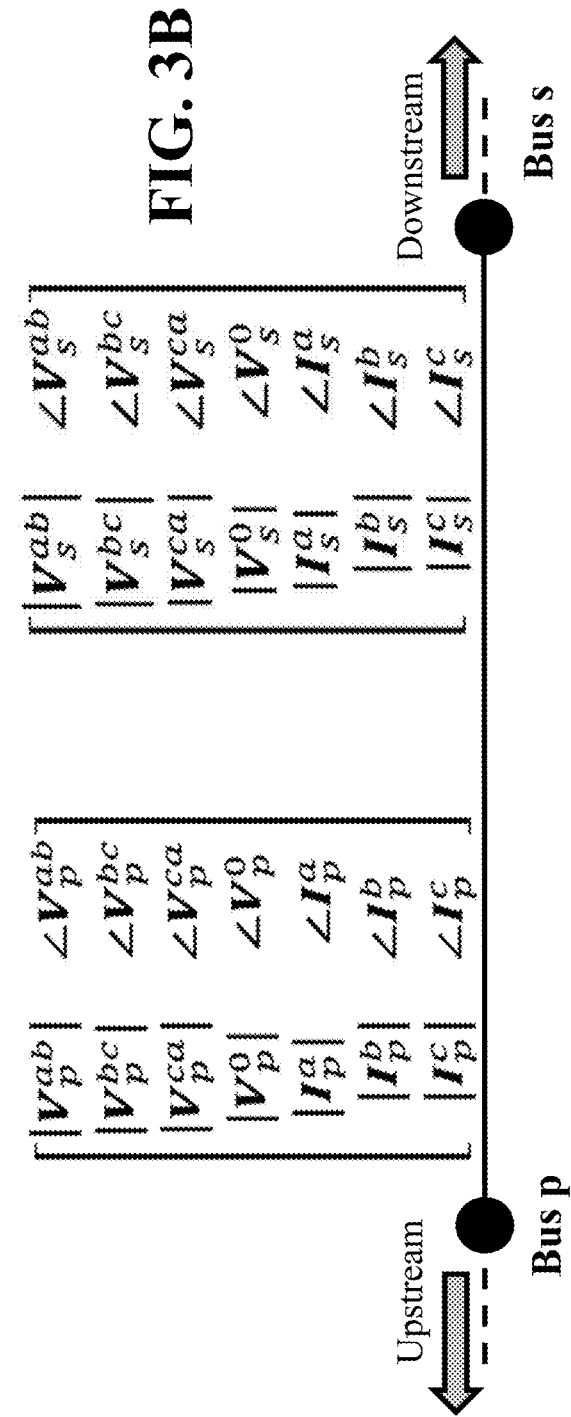

DISTRIBUTION FAULT LOCATION USING GRAPH NEURAL NETWORK WITH BOTH NODE AND LINK ATTRIBUTES

FIELD

The present disclosure relates generally to electric power systems, and more particularly to detection and location of short circuit faults in power distribution systems.

BACKGROUND

Power distribution systems are constantly under the threat of short circuit faults that would cause power outages. In order to enhance the operation quality and reliability of power distribution systems, system operators have to deal with outages in a timely manner. Thus, it is of paramount importance to accurately locate and quickly clear faults immediately after the occurrence, so that quick restoration can be achieved.

Existing fault location techniques in the literature can be divided into several categories, namely, impedance-based methods, traveling wave-based methods, and machine learning-based methods. Impedance-based fault location methods use voltage and current measurements to estimate fault impedance and fault location. However, the accuracy of impedance-based methods can be affected by factors including fault type, unbalanced loads, heterogeneity of overhead lines, and measurement errors. Traveling wave-based methods use observation of original and reflected waves generated by a fault. In general, however, traveling wave-based methods require high sampling rates and communication overhead of measurement devices, or additional signal injection with a given frequency. Machine learning models are leveraged for fault location in distribution systems, such as artificial neural networks (ANNs), support vector machines (SVMs), convolutional neural networks (CNNs) and graph convolutional networks(GCNs). However, the conventional machine learning based approaches estimate fault locations solely by learning a relationship between buses measurements and fault locations with a given configuration of connectivity, but ignored impacts of topology configurations, branch regulations on fault behaviors. Since power distribution systems behaviors under fault conditions heavily rely on topology configurations and branch regulations, the conventional learned relationship approaches between these fault location and measurements become invalid. Some reasons why these conventional learned relationship approaches become invalid is due to adjustments to the data, i.e. fault locations with a given configuration of connectivity), which because of these adjustments to the data, then a new learning process that requires a tremendous computation effort has to be re-taken.

For example, patent application US 2003/0085715 A1 discloses a method to locate a fault by detecting a faulted phase from the plurality of phases of the power distribution system. A measurement signal having a measurement frequency is injected into the detected faulted phase, the measurement frequency being a different frequency than the line frequency. The fault location is determined for a selected segment based on at least one measured residual current corresponding to the injected signal and a predetermined relative impedance of the power distribution system. However, the US 2003/0085715 A1 method fails to meet today's power industry's demands for requiring an additional injection signal having a pre-determined frequency, such that the fault location cannot be determined based on conventional measurements available to the utilities. U.S. Pat. No. 5,537,327 A, discloses a method and apparatus for detecting and enabling a clearance of high impedance faults in a distribution system. Current in at least one phase in the power distribution system is monitored in real time by sensors, and related features are converted from time domain to frequency domain. The transformed data is then applied to a trained neural network, which provides an output trigger signal when an HIF condition is probable. However, the U.S. Pat. No. 5,537,327 A methods fails to consider impacts of system topology and branch regulations on fault behaviors, and the fault detection by the U.S. Pat. No. 5,537,327 A methods are not accurate when system topology and branch parameters are changed.

Therefore, there is a need for more advanced fault detection and location systems and methods that make full use of conventionally available measurements used by power industries, and include impacts of system topology, branch parameters, regulation and others on fault behaviors, to more accurately locate and quickly clear faults in a timely manner after the occurrence, to further enhance the quality and reliability of power distribution network operation.

SUMMARY

The present disclosure relates to detection and location of short circuit faults in power distribution systems.

Some embodiments of the present disclosure use a graph neural network (GNN) based fault location method for power distribution systems, in which both node attributes and branch attributes are considered. The node attributes can include measured phase to phase voltages and zero-sequence voltages, or measured phase to ground voltages that both include magnitude and angle measurements, and measured SUN et al.

injection currents that include magnitude and angle measurements. The branch attributes can include at least partial of equivalent nodal conductance and susceptance matrices corresponding to nodes separated by the branch.

Some aspect why branch information is important in terms of the embodiments of the present disclosure for detecting fault locations is because each branch (also referred as a link or a line branch) represents a hypostatic relationship between two entities, with concrete attributes, unlike information obtained at each node (also referred as bus, utility pole or pole). By-non-limiting example, a branch connecting two nodes, can have different impedance and admittances measurements when compared to measurements taken at either of the two nodes. Therefore, considering measurements associated with these branch attributes, allows for an opportunity to recover exact relationships between a pair of nodes (i.e., buses, utility poles or poles), which are ignored in conventional GCNs approaches.

In fact, conventional GCN approaches achieve fault detection by aggregating-rank of local neighborhood information for individual graph nodes which effectively leverages low proximities and node features of a graph. These conventional GCN approaches are solely based on nodal measurements configured to learn relationships between a fault node (i.e., bus) and measurements (node measured phase voltage & current values). These conventional GCN approaches determine a fault location at a single bus, so an outage-worker can be dispatched to a bus location to search for a fault spot. However, there are many problems with these conventional GCN approaches, for example, the simplifying of attributes from graph links into binary or scalar values that describe node connectedness to identify neighborships and their influence if weighted in the local neighborhoods. The problem is that the attributes that graph links carry, are ignored due to the existing capability of GCNs. Another problem is that these conventional GCN approaches don't effectively model impacts of system topology on the fault behaviors. For example, the series impedances of a line, affect the relationship between fault locations and fault currents. Which means, same fault currents can result from a different fault location if impedances are not the same. Because these conventional GCN approaches detect fault locations at the bus, when workers are dispatched to the bus location, the workers don't know which direction along line/branch to walk, either downstream or upstream, of the bus location, to find fault. Due to the workers not knowing which direction to look for the fault, downstream or upstream, a tremendous amount of man power and repair time are wasted, which means, an additional amount time of the power outage time is extended that customers do not receive power. Thus, these conventional GCN approaches fail, because without knowing the attributes that graph links carry, it is difficult to find exact relationships between a fault location and the system topology and characteristics. Further, without having the exact relationships, it is difficult to accurately identify a fault location on a line/branch between nodes.

At least one realization gained while testing fault location methods during experimentation is that in real-world fault location scenarios, a branch (also referred as a link, a line branch or branch) separating a pair of nodes (also referred as buses, utility poles, or poles), carry a lot more information than a simple indicator of neighborship, such as information obtained at each node location. Nodes are considered as buses, utility poles or poles supporting distribution power lines or overhead power lines of an electric power utility. Each branch is a section of overhead power lines between a pair of nodes of a distribution feeder. The term, distribution or distributor, can be understood as an overhead distribution line from which tapping are taken along a length of the line for providing a supply of power to a consumer or some other power supply aspect. The term feeder can be thought of as the line carrying current from a distribution/primary substation to a secondary substation or as a primary distribution line. Thus, predetermined operational electrical (POE) characteristics or past operational data associated with fault behaviors of past detected faults can be obtained for each node and each branch for each distribution feeder, that can be utilized with the fault detection systems and methods of the present disclosure.

Some challenges to overcome when developing the embodiment of the present disclose is to determine a fatilt location on branch between a pair of nodes which is more difficult than at node location and is more realistic to real life situations where most faults happen along branch, not at the node. As noted above, one realization is that branch information provides a series of impedance and shunt admittances that affected current allocations and voltage levels. Another realization is that when detecting a fault location, the systems and methods of the present disclosure should use branch attributes, system topology and given measurements at buses/nodes, in order to find an exact fault location, if a short circuit (fault) event occurs in a branch or at a bus/node, in a feeder of a power grid. For example, the systems and methods of the present disclosure can integrate multiple measurements at different buses with branch parameters at different branches as inputs of the GNN, and can transform fault locations on branches into output features of corresponding connected nodes for the faulted branch. To accurately capture the faulted phases, the measurements of voltages and currents for all phases can be used. Besides a system topology that can be naturally considered by the GNN, the branch parameters and related regulation and energization statuses can be explicitly taken into account, as link attributes.

In order to use a uniform set of parameters to represent branches with different types, embodiments of the present disclosure can use an equivalent nodal conductance matrix and an equivalent nodal susceptance matrix to represent the branch features. In regard to branches with branch impedances, the required conductance and susceptance matrices can be easily formulated, however it is difficult for a branch equipped with a voltage regulator or a switch due to zero branch impedances. For a voltage regulator branch, some embodiments of the present disclosure have merged the voltage regulator branch with a downstream line, and derived corresponding equivalent conductance and susceptance matrices using the voltage and current amplifying factors of the regulator and the series impedance and shunt admittances of the line. For a switch branch, the switch branch can be merged with a downstream line, and corresponding equivalent conductance and susceptance matrices are determined by using the phase energization matrix of the switch and the series impedance and shunt admittances of the line.

Some embodiments of the present disclosure can map the fault detection and location problem into a non-linear regression or classification problem according to the formulations of node output feature and solved through an extended GCN model with both node and link attributes. This extended GCN model takes both node and link attributes as inputs, in which links are reverted to hypostatic relationships between entities with discretional attributes. To adequately captures the interactions between link and node attributes, their tensor product is used as neighbor features. Besides, to accelerate the training process, the sum of features in entire neighborhoods are estimated through Monte Carlo method, with a sampling strategy for minimizing the estimation variance. To make training time predictable, the set of nodes to be trained can be divided into number of batches, and each batch has a fixed number of nodes. To facility model migration to other distribution systems, a fixed number of neighbor samples can be considered for each node by randomly chosen from all neighbors of the node under study, and the impacts of neighbors to the node is evaluated based on sampled neighbors and sampling probability. In addition, the node features, branch features and output features are normalized before using for facilitating migrations to other systems with different topologies.

Some embodiments of the present disclosure can configure the GNN to use a set of graph processing layers to aggregate node features and branch features into hidden node representations, and a set of full-connected prediction layers to relate hidden node representation with output features relating fault location. This GNN of the present disclosure can be trained to learn a relationship between fault locations on a branch and measurements or parameters of related buses/branches and their limit number of neighbors. Although the GNN is trained using a sample system with specific topology, this GNN of the present disclosure can be used for other systems as well, if the numbers of node features, branch numbers and output features are the same.

Practical Applications

The present embodiments are solving a power industry specific technical problem of how to detect a fault and a fault location in a line branch between the buses/nodes/poles either before or during an outage? Some reasons this is important to the power industry to identify the fault and location quickly, is that operators need to make necessary organizational preparations for assigning resources such as assigning the correct technically skilled outage work crews, right type of equipment specific to the fault type and ordering repair parts for an outage. These resources may be local or out-of-state, so for these operators accurately detecting and locating faults is imperative to quickly addressing the outage as well as not to waste resources. Many utilities are plagued by failing to correctly assign resources which results in failing to quickly clear the outage. For example, in 2020 storms across the United States resulted in outages resulting in millions of customers losing power. In fact, the United States power grids are outdated and rundown and are the worst condition than any other developed country (see Ula Chrobak's article "The US has more power outages than any other developed country. Here's why", Aug. 17, 2020, Popular Science). Other reasons to accurately detect and locate faults means that power grids are better prepared which allows the power grid to be more cost efficient, and just as important instill confidence to their customers knowing that their utility (power grid) is determining the outage preparedness decisions on real quantitative analysis rather than through making assumptions. Thus, there is a need for a system and/or method that is capable of monitoring and diagnosing equipment health, with the capability of continuously monitoring distributed energy system operation to detect and localize impending faults, and isolate faulty sections of system equipment.

The present disclosure systems and methods are solving a power industry specific technical problem by determining whether a branch has a fault, a location of the fault within the branch between buses/nodes/poles, and outputting a classification of the fault and the fault location to operators. These solutions provide better resolution to anticipated impending faults, monitor their developments, determine the underlying causes, and specify their locations. In fact, many challenges were overcome and realizations realized as branch information provides a series of impedance and shunt admittances that affected current allocations and voltage levels, and using branch attributes, system topology and given measurements at buses/nodes, need to included order to find an exact fault location, if a short circuit (fault) event occurs in a branch or at a bus/node, in a feeder of a power grid.

For example, technical effects of the embodiments of the present disclosure arise by integrating multiple measurements at different buses while taking system topology and branch parameters into account. The measurements at buses and impedance, admittance and regulation parameters at branches are modeled as node and link attributes in the GNN model, respectively. Specifically, the GNN uses graph processing layers with node and link attributes to map system topology, bus measurements and branch parameters into hidden node embeddings, and full connected layers to relevant fault locations to node embeddings. The embodiments of the present disclosure can be used for various fault types, including single-phase to ground, double-phase to ground, phase to phase short-circuit, triple-phase to ground and three phase short-circuit. As noted above, the node attributes of the graph include measured phase voltage and current measurements, and branch impedance, admittance and regulation parameters are integrated into link attributes of the graph. Also noted above, a link between a pair of nodes carries a lot more information and represents a hypostatic relationship between two entities, usually with concrete attributes. For example, a line branch connected with two buses may have different impedance and admittances. The above realization are significantly more due to the fact that conventional GCN approaches fail, because without knowing the attributes that graph links carry, it is difficult to find exact relationships between a fault location and the system topology and characteristics. Further, without having the exact relationships, it is difficult to accurately identify a fault location on a line/branch between nodes. These above additional limitations reflect an improvement in the technical field of power distribution systems, that integrate features and aspects into a practical application, and these features and aspects provide meaningful limitations to the solution to the technical problem. Thus, the systems and methods as a whole, cannot be viewed merely as performing aspects in the human mind, nor gathering (collecting) data, processing data, analyzing data, and displaying certain results, in terms of being abstract. In contrast, the systems and methods detect faults in distribution feeders, determining a fault location in a line branch between nodes/poles, isolating the feeder with the fault for other feeders, rerouting power and restoring service to disconnected power or loads of the feeder with the fault. These solutions further solve the technical problem of detecting and locating faults that will reduce outage by providing utility's engineers and emergency preparedness staff with accurate determining of whether a branch has a fault, a location of the fault within the branch, and a classification of the fault assists managing risks of outages, to quickly resolve the situation.

According to an embodiment of the present disclosure, a method for fault detection and localization of a distribution feeder connected to a power distribution system. The method including using a computing system having circuitry configured for processing, the distribution feeder, the distribution feeder having predetermined operational electrical (POE) characteristics, such that the distribution feeder is divided into branches separated by nodes. Receiving real-time measured pre-fault regulations and energizations (RM-PRE) branch raw data and real-time measured during-fault voltages and currents (RMDVC) node raw data, of the distribution feeder. Generating, from the RMPRE branch raw data and the POE characteristics, a branch attribute dataset for each branch separating a pair of nodes for all the branches of the distribution feeder. Generating, from the RMDVC node raw data and the POE characteristics, a node attribute dataset for each node for all the nodes of the distribution feeder. Inputting the branch attribute datasets and the node attribute datasets into a trained fault detection neural network to determine whether a branch has a fault and a location of the fault within the branch, and to output a classification of the fault and the fault location, and displaying the fault classification and the fault location.

According to another embodiment of the present disclosure, a method performed by a fault detection apparatus for fault detection and localization in distribution feeders having branches and nodes. The method including receiving feeder raw data in a distribution feeder of a power distribution system. Processing the feeder raw data with predetermined operational electrical characteristics of the distribution feeder to generate a branch attribute dataset for each branch separated by a pair of nodes for all branches. Generate a node attribute dataset for each node for all the nodes in the distribution feeder. Inputting the branch attribute datasets and the node attribute datasets into a trained fault detection neural network to determine whether a branch has a fault and a fault location within the branch, to output a classification of the fault and the fault location. Generate an alert signal based upon determining the classified fault and fault location. Send the alert signal to an alert control system, upon the alert signal being received, generate an action in response to the alert signal to an outage response system.

According to another embodiment of the present disclosure, a fault detection apparatus for fault detection and localization in distribution feeders having branches and nodes. The fault detection apparatus including a computing system having a transceiver and data storage with instructional modules. The fault detection apparatus includes circuitry configured for processing to cause the apparatus to receive, via the transceiver, feeder raw data in a distribution feeder of a power distribution system. Process, via the processor, the feeder raw data with predetermined operational electrical characteristics of the distribution feeder data accessed via the data storage, to generate a branch attribute dataset for each branch separated by a pair of nodes for all branches. Generate a node attribute dataset for each node for all the nodes in the distribution feeder. Input the branch attribute datasets and the node attribute datasets into a trained fault detection neural network to determine whether a branch has a fault and a fault location within the branch, to output a classification of the fault and the fault location. Generate an alert signal based upon the determining of the classified fault and fault location. Send, via the transceiver, the alert signal to an alert control system. Upon the alert signal being received, the alert control system generates an action in response to the alert signal to an outage response system to reroute power and restore service to the disconnected power of the distribution feeder with the fault.

According to another embodiment of the present disclosure, a non-transitory computer readable medium, having a computer program thereon, wherein the computer program, when executed by a processor of a fault detection apparatus, causes the processor to receive feeder raw data including real-time measured pre-fault branch regulations and energizations data, and real-time measured during-fault node voltages and currents raw data, in a distribution feeder of a power distribution system. Process the feeder raw data with predetermined operational electrical characteristics of the distribution feeder to generate a branch attribute dataset for each branch separated by a pair of nodes for all branches. Generate a node attribute dataset for each node for all the nodes in the distribution feeder. Input the branch attribute datasets and the node attribute datasets into a trained fault detection neural network to determine whether a branch has a fault and a fault location within the branch, to output a classification of the fault and the fault location. Generate an alert signal based upon determining the classified fault and fault location. Reroute power and restore service to the disconnected power of the distribution feeder with the fault, based upon the alert signal being sent to, and received by, an outage response system.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

FIG. 3A is an illustrating node features for buses of a grounded power distribution system, according to some embodiments of the present disclosure;

FIG. 3B is an illustrating node features for buses of an ungrounded power distribution system, according to some embodiments of the present disclosure;

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The present disclosure relates to detection and location of short circuit faults in power distribution systems.

Figure 1A:
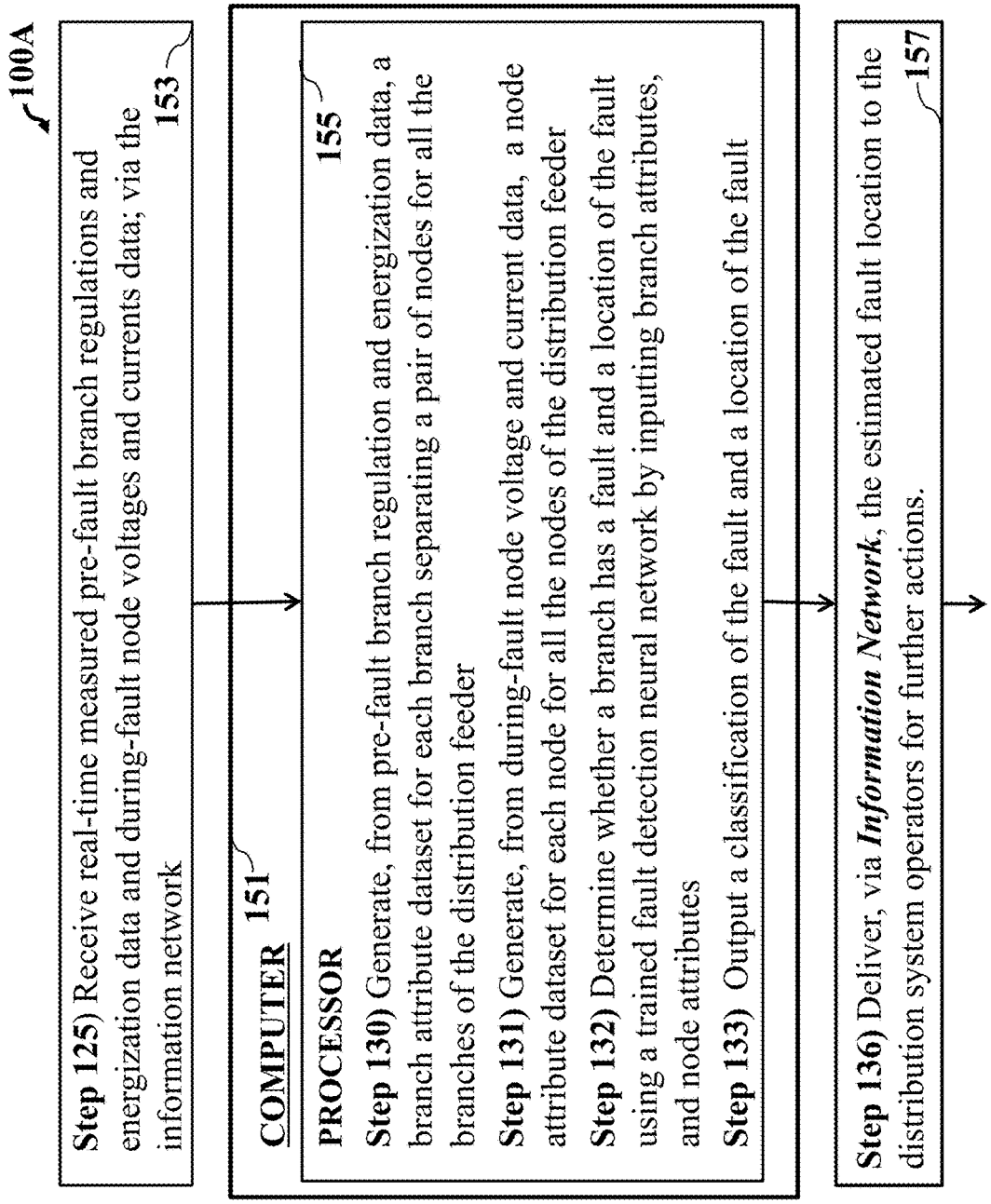
FIG. 1A is a block diagram illustrating some steps for a method for detecting and locating a fault in a power distribution system, according to some embodiments of the present disclosure.
Figure 1B:
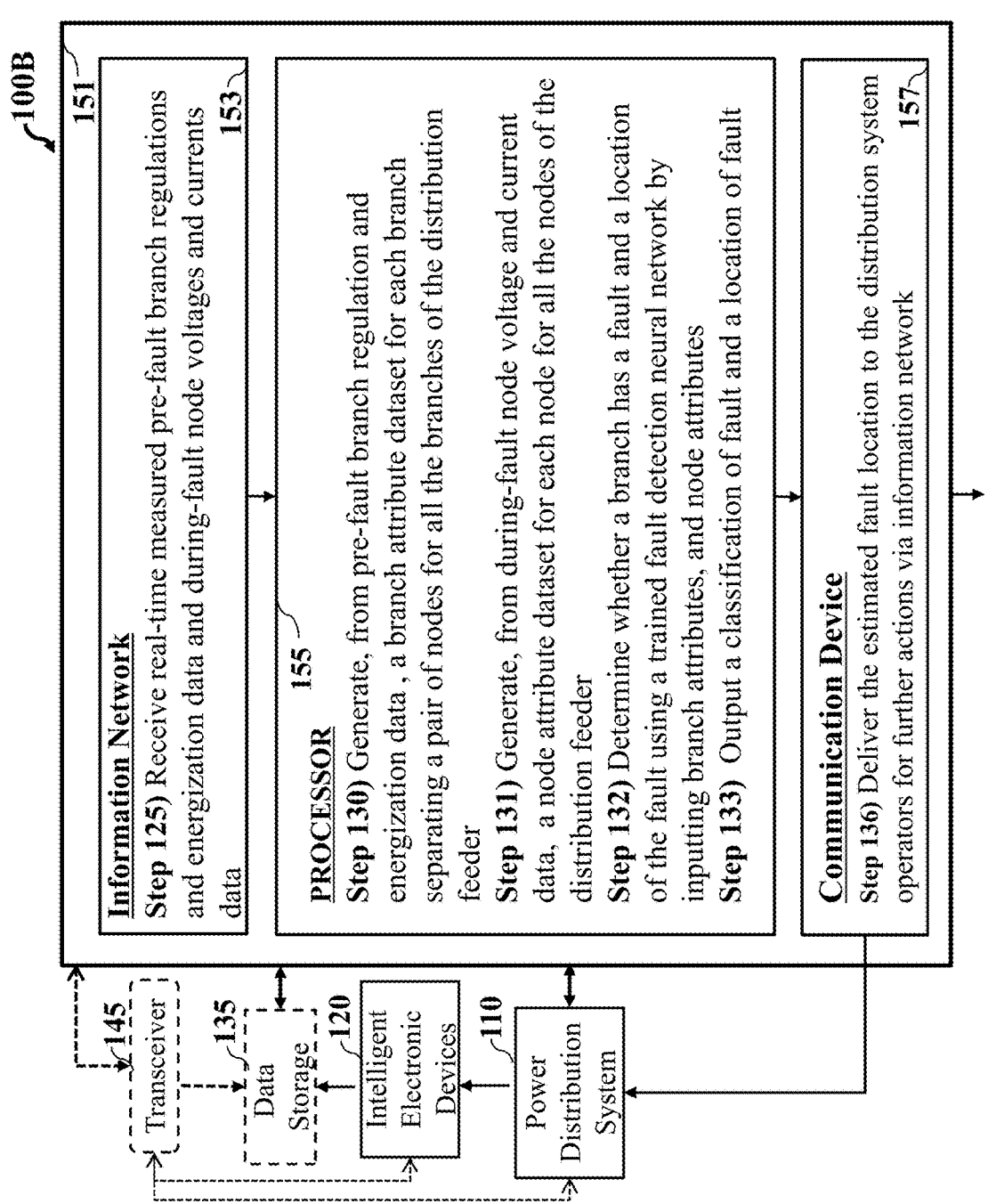
FIG. 1B is a schematic illustrating some method process flow steps and some components for implementing a method, according to some embodiments of the present disclosure.

FIG. 1A is a block diagram illustrating some steps for a method for detecting and locating a fault in a power distribution system, according to some embodiments of the present disclosure. FIG. 1B is a block diagram illustrating the system of FIG. 1A, wherein the system is implemented using some components, according to some embodiments of the present disclosure.

Referring to FIG. 1A and FIG. 1B, step 125 of FIG. 1A includes the method 100A that receives real-time measured pre-fault branch regulations, measured energization data and measured during-fault node voltages, and measured current data; via the information network 153 of FIG. 1B.

Step 130 of FIG. 1A includes using a hardware processor 155 of a computer 151 of FIG. 1B to generate, from pre-fault branch regulation and energization data, a branch attribute dataset for each branch separating a pair of nodes for all the branches of the distribution feeder.

Step 131 of FIG. 1A using the hardware processor 155 of FIG. 1B to generate, from during-fault node voltage and current data, a node attribute dataset for each node for all the nodes of the distribution feeder.

Step 132 of FIG. 1A includes using the hardware processor 155 of FIG. 1B to determine whether a branch has a fault and a location of the fault using a trained fault detection neural network by inputting branch attributes, and node attributes. Step 133 includes outputting a classification of the fault and a location of the fault.

Step 136 of FIG. 1A, uses a communication device 157 of FIG. 1B to deliver the estimated fault location to the distribution system operators for further actions via information network 153 of FIG. 1B.

Referring to FIG. 1B can include the computer or a computer system 151, which consists of a hardware processor 155 in communication with an input interface 145, a memory 135, an information network 153, a communication device 157. The communication device 157 can be connected to the power distribution system 110 that equipped with intelligent electronic devices 120. The computer 151 can send and receive information from and to power distribution systems. It is contemplated the hardware processor 155 can include two or more hardware processors depending upon the requires of the specific application. Certainly, other components may be incorporated with method 100A and system 100B including input interfaces, output interfaces and transceivers. Step 125 of FIG. 1B receives real-time measured pre-fault branch regulations and energization data and during-fault node voltages and currents data via the information network 153. Step 130 use the hardware processor 155 of a computer 151 to generate, from pre-fault branch regulation and energization data, a branch attribute dataset for each branch separating a pair of nodes for all the branches of the distribution feeder. Step 131 uses the hardware processor 155 to generate, from during-fault node voltage and current data, a node attribute dataset for each node for all the nodes of the distribution feeder. Step 132 determines whether a branch has a fault and a location of the fault using a trained fault detection neural network by inputting branch attributes, and node attributes, and step 133 outputting a classification of the fault and a location of the fault. Step 136 uses a communication device 157 to deliver the estimated fault location to the distribution system operators for further actions via information network 153.

Figure 1C:
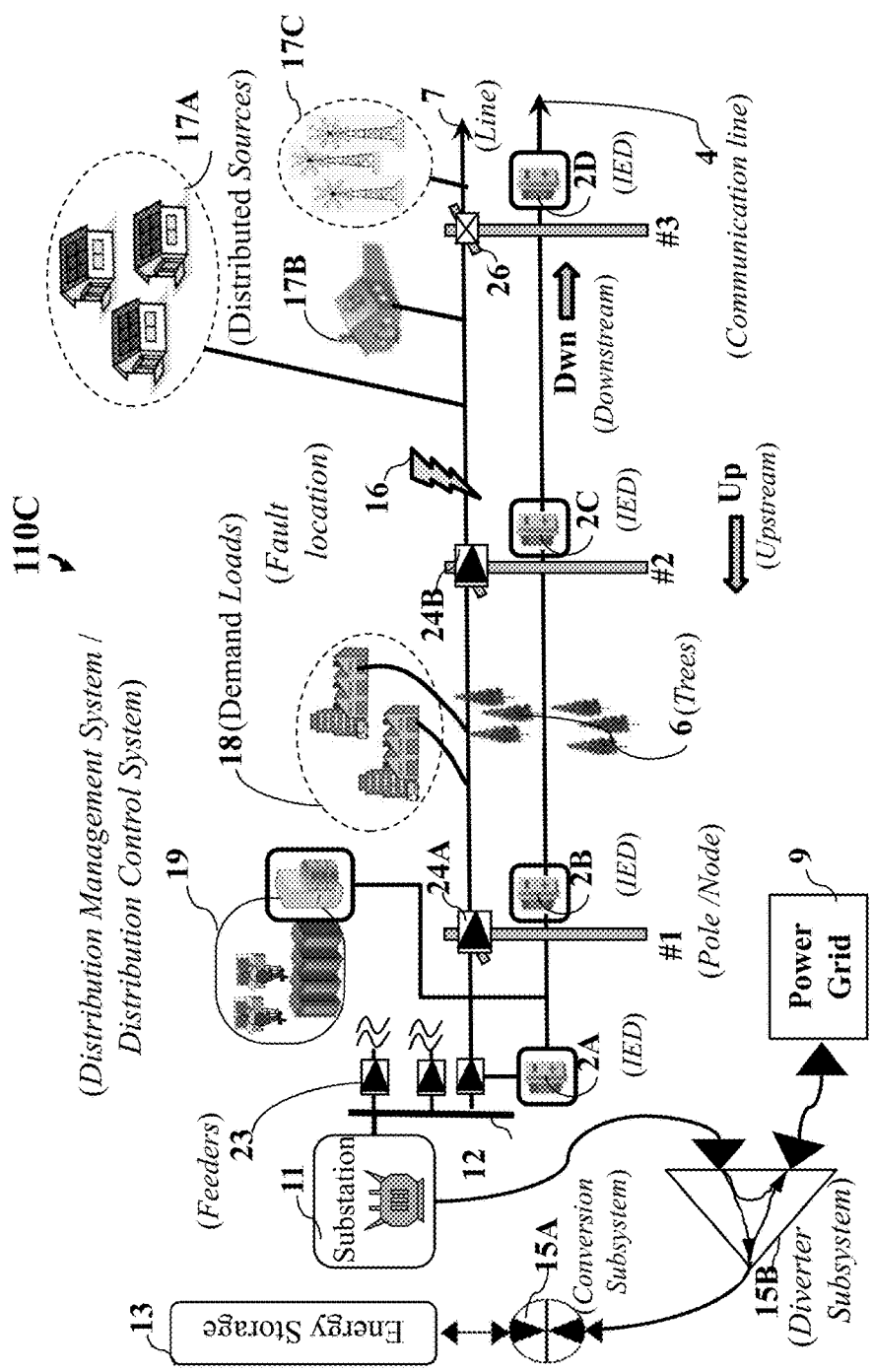
FIG. 1C is a schematic illustrating a power distribution system with intelligent electronic devices (IED) and distribution management system (DMS) or distribution control system (DCS), according to some embodiments of the present disclosure.

FIG. 1C is a schematic illustrating a power distribution system 110C with intelligent electronic devices (IED) and distribution management system (DMS) or distribution control system (DCS) 19, according to some embodiments of the present disclosure. The power distribution system 110C is operated and controlled by the DMS or DCS 19, and DMS 19 offers a set of functionalities to control and manage the power distribution system 110C under various normal and emergency conditions. One of DMS 19 functionalities is to detect and locate short circuit faults 16 based on real-time measurements collected from the power distribution system 100C when such events occur. The short circuit fault can occur for a variety of reasons, such as fallen trees 6, and insulation damage. The measurements can be provided by various sensing and controlling devices, such as intelligent electronic devices (IED) 2A-2D, phase measurement units (PMU) (not shown), tap changer (not shown) and switch controller (not shown). The DMS 19 communicates with sensing and controlling devices through wired or wireless communication networks 4.

Still referring to FIG. 1C, the power distribution system 100C gets power from a power grid (i.e. transmission system) 9 or diverter subsystem 15B, and local distributed generations such as solar panels 17A, bio systems 17B and wind plants 17C, and delivers the power to the demand load customers 18 through distribution lines 7. The distribution system 110C connects with the transmission system 9 or diverter system 15 through a substation 11. The diverter system 15B provides power supply that converted 15A from energy storages 13 or other external sources. The substation 11 connects with a downstream bus 12 and the bus 12 is connected with a set of downstream feeders 23. Each feeder 23 includes a set of line segments 7 (each line segment (i.e. line branch, link) is between each pair of poles 1-2, 2-3, etc.). There are also switchable devices to adjust connectivity of the distribution system, including feeder/circuit breakers 23, normally-open switches 26, and normally-closed switches 24A, 24B mounted on the power poles #1, #2, #3. The power from transmission system 9 or diverter system 15B may also deliver power to the demand load customers 18 through various voltage regulating devices (not shown), such as voltage regulators, and transformers (not shown). Although FIG. 1C is a schematic illustrating a single line diagram, in reality, the power distribution system 100C can have either a 3-phase 4 wire system or a 3-phase 3 wire system, depending upon the user equipment configuration and requirements.

Figure 2:
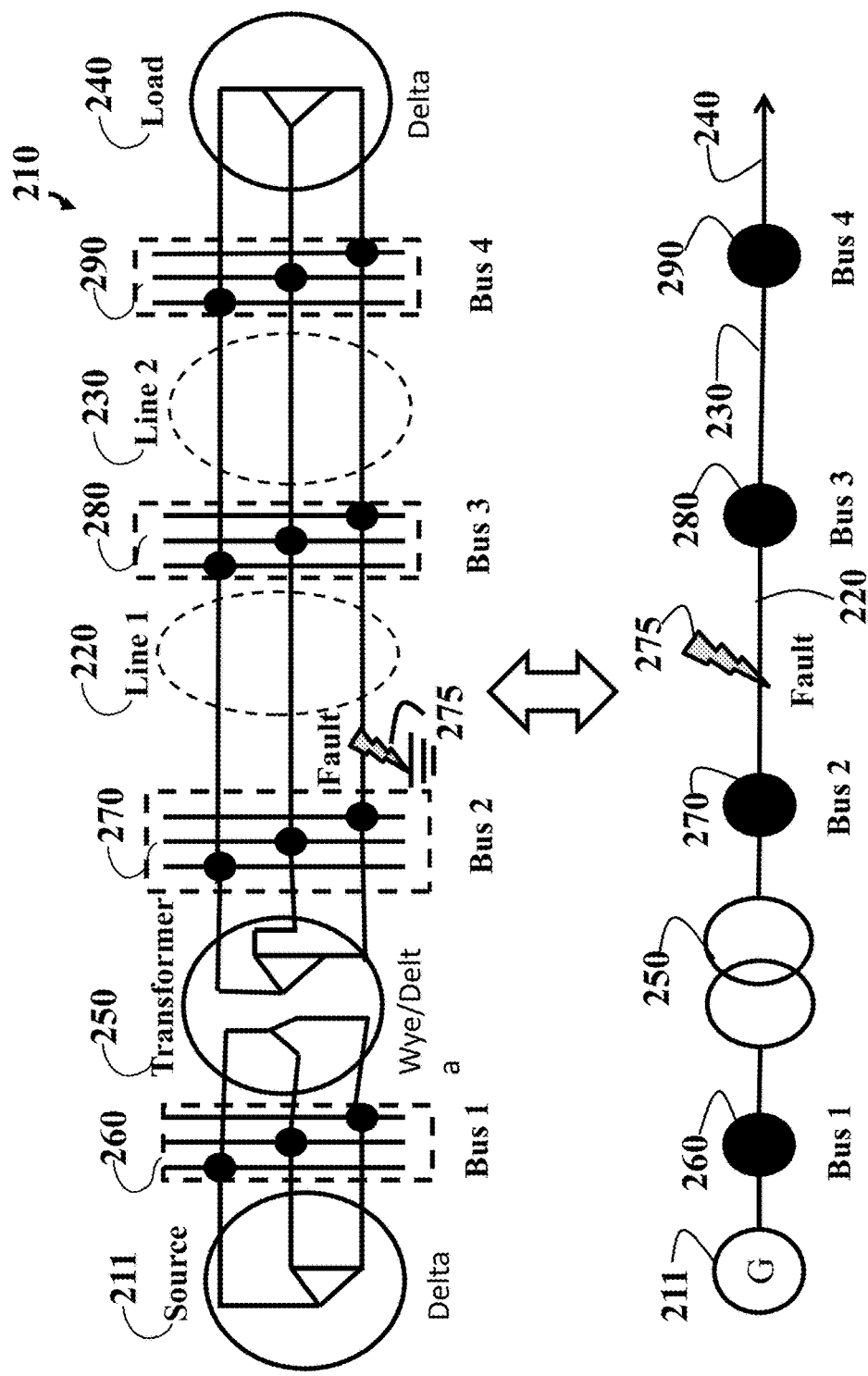
FIG. 2 is a schematic of a power distribution system with a short-circuit fault in three-phase representation (upper portion), and a single line diagram (lower portion) is also provided for comparison, according to some embodiments of the present disclosure.

FIG. 2 shows schematic diagram of a power distribution system with a short-circuit fault in three-phase representation (upper portion), and a single line diagram (lower portion) is also provided for comparison. The power distribution system 210 includes one Delta-connected three-phase source 211, two three-phase distribution lines 220 and 230, one Delta-connected three-phase load 240, and one transformer with Wye/Delta connection 250. There are four three-phase buses in the system 210, including bus 1, 260, bus 2, 270, bus 3, 280 and bus 4, 290, such that each bus has three phases. The power distribution system 210 can be categorized into an ungrounded distribution system, and a grounded distribution system. The power distribution system 210 is a grounded system if it has a direct connection with a ground through a device, such as a transformer, or a load. Meanwhile, the power distribution system 210 is an ungrounded system if it does not have a direct connection with the ground. FIG. 2 shows a sample ungrounded distribution system. In addition, there is a single-phase-to-ground short circuit fault 275 on the line 220.

When there is a short-circuit fault 275 occurring in any distribution line 220 or bus 1-4, we have to find the exaction location of the fault based on real-time measurements that can be sensed from buses 1-4, and a system topology and branch parameters can be provided by a switch controller, transformer/regulator tap changer, and other information sources of the power distribution system 210.

Still referring to FIG. 2, when modeled the power distribution system 210 can be as a graph, the buses and branches of the power distribution system 210 can be regarded the nodes and links of the graph. The measurements at the buses are regarded as node features, and the parameters of the branches as link features. The fault locations are modeled as output features of nodes. The fault locating is to find a relationship between output features with node features and link features. Once a new fault occurs, the fault type and fault location can be determined if the node features and link features corresponding to the fault are available.

FIG. 3A is an illustrating node features for buses of a grounded power distribution system, according to some embodiments of the present disclosure. Specifically, FIG. 3A illustrates a set of measurements collected from a bus of a grounded distribution system that will be used as node features by a graph neural network. We assume that the voltage and current phasor measurements are available at phases that are connected to loads and distributed generations. That is, for a given measured bus in a distribution system, we have access to its three-phase voltage and current phasors ($|V_p^x|$, $\angle V_p^x |I_p^x|$, $\angle I_p^x$, $x \in \{a, b, c\}) \in \mathbb{R}^{12}$, where $|\bullet|, \angle \bullet$ stands for an absolute value and a phase angle of a complex number, $V_p^x$ and $I_p^x$ denotes phase voltage and phase injection current at phase x of bus p. Values corresponding to unmeasured phases are set to zero. A data sample of measurements from the grounded distribution system can then be represented as $X \in \mathbb{R}^{n \times 12}$, where n is the number of buses.

FIG. 3B is a schematic illustrating node features for buses of an ungrounded power distribution system, according to some embodiments of the present disclosure. Specifically, FIG. 3B illustrates a set of measurements collected from a bus of an ungrounded distribution system that will be used as node features by a graph neural network. For a given measured bus in a ungrounded distribution system, we have access to its three-phase-to-phase voltage and current phasors, and zero-sequence voltage phasor, ($|V_p^{xy}|$, $\angle V_p^{xy}$, $xy \in \{ab, bc, ca\}$; $|V_p^0|$, $\angle V_p^0$; $|I_p^x|$, $\angle I_p^x$, $x \in \{a, b, c\}) \in \mathbb{R}^{14}$, where, $V_p^{xy}$ denotes phase-to-phase to-phase voltage between phase x and y of bus p. A data sample of measurements from the ungrounded distribution system can then be represented as $X \in \mathbb{R}^{n \times 14}$, where n is the number of buses to be considered.

The distribution system has branches with various types, such as distribution line, transformer, breaker or switch, voltage regulator. In order to use a uniform data set representing various types of branches, we use an equivalent nodal conductance matrix $G^{eqv}$ and an equivalent nodal susceptance matrix $B^{eqv}$ to represent branch features of graph neural network.

Figure 4A:
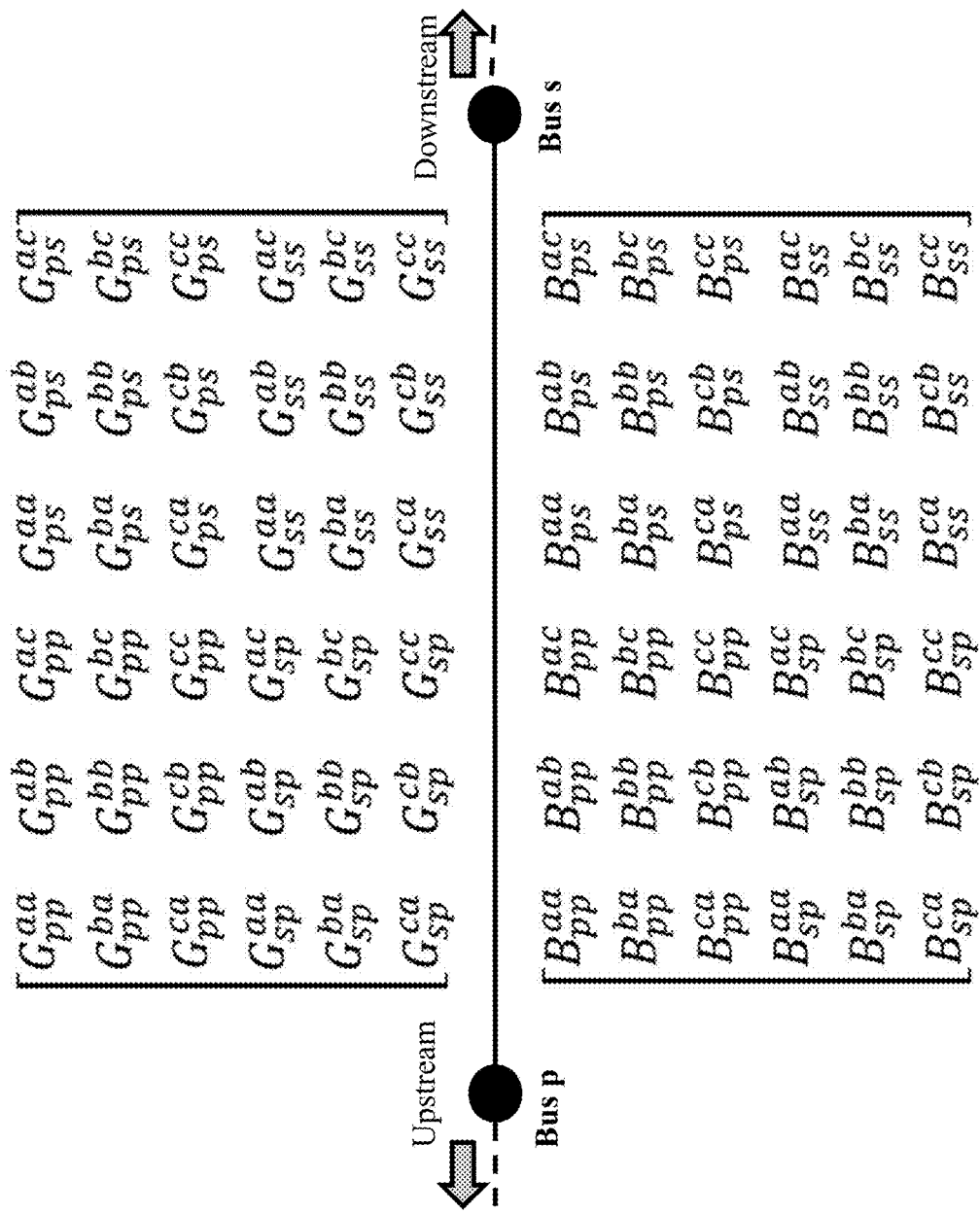
FIG. 4A is a schematic illustrating some link features for branches of a power distribution system, according to some embodiments of the present disclosure.

FIG. 4A is a schematic illustrating some link features for branches of a power distribution system, according to some embodiments of the present disclosure. Specifically, FIG. 4A illustrates a set of branch features defined for a branch between bus p and bus s. The parameters for a given branch between bus p and bus s include ($G_{pp}^{xy}$, $B_{pp}^{xy}$, $G_{ps}^{xy}$, $B_{ps}^{xy}$, $G_{sp}^{xy}$, $B_{sp}^{xy}$, $G_{ss}^{xy}$, $B_{ss}^{xy}$, $xy \in \{aa, ab, ac, ba, bb, bc, ca, cb, cc\}) \in \mathbb{R}^{72}$, and the branch parameters of the system can be represented as $Y \in \mathbb{R}^{m \times 72}$, where m is the number of branches to be considered.

The branches can be categorized into impedance-based branches, and zero-impedance branches. The impedance-based branches include distribution lines, and transformers. The zero-impedance branches include voltage regulators, circuit breakers, and switches.

Still referring to FIG. 4A, for a branch with series impedance, the equivalent nodal conductance matrix $G^{eqv}$ and the equivalent nodal susceptance matrix $B^{eqv}$ can be derived according to branch currents and terminal bus voltages of the branch. The relationship of branch currents and bus voltages for an impedance branch between bus p and bus s can be described as follows:

$$\begin{bmatrix} I_{ps} \\ I_{sp} \end{bmatrix} = \begin{bmatrix} Y_{pp} & Y_{ps} \\ Y_{sp} & Y_{ss} \end{bmatrix} \begin{bmatrix} V_p \\ V_s \end{bmatrix} \quad (1)$$

$I_{ps}$ and $I_{sp}$ are the vectors of phase currents flowing through bus p, and bus s into the branch respectively. $V_p$ and $V_s$ are the vectors of phase voltages at bus p and bus s. $Y_{pp}$ and $Y_{ss}$ are the self admittance matrix at bus p and bus s; $Y_{ps}$ and $Y_{ps}$ are the mutual admittance matrices between bus p and bus s, and bus s and bus p. The equivalent nodal conductance and susceptance matrix, $G^{eqv}$ and $B^{eqv}$ are the real and imaginary parts of an equivalent nodal admittance matrix $Y^{eqv}$:

$$G^{eqv} + jB^{eqv} = Y^{eqv} \quad (2)$$

And the equivalent nodal admittance matrix $Y^{eqv}$ is defined as:

$$Y^{eqv} = \begin{bmatrix} Y_{pp} & Y_{ps} \\ Y_{sp} & Y_{ss} \end{bmatrix} \quad (3)$$

For a three-phase branch, all branch currents and bus voltages are 3 by 1 vectors, and self and mutual admittance matrices are 3 by 3 matrix.

The equivalent nodal conductance and susceptance matrices for a distribution line is determined according to a series impedance matrix and a shunt admittance matrix for the line.

Figure 4B:
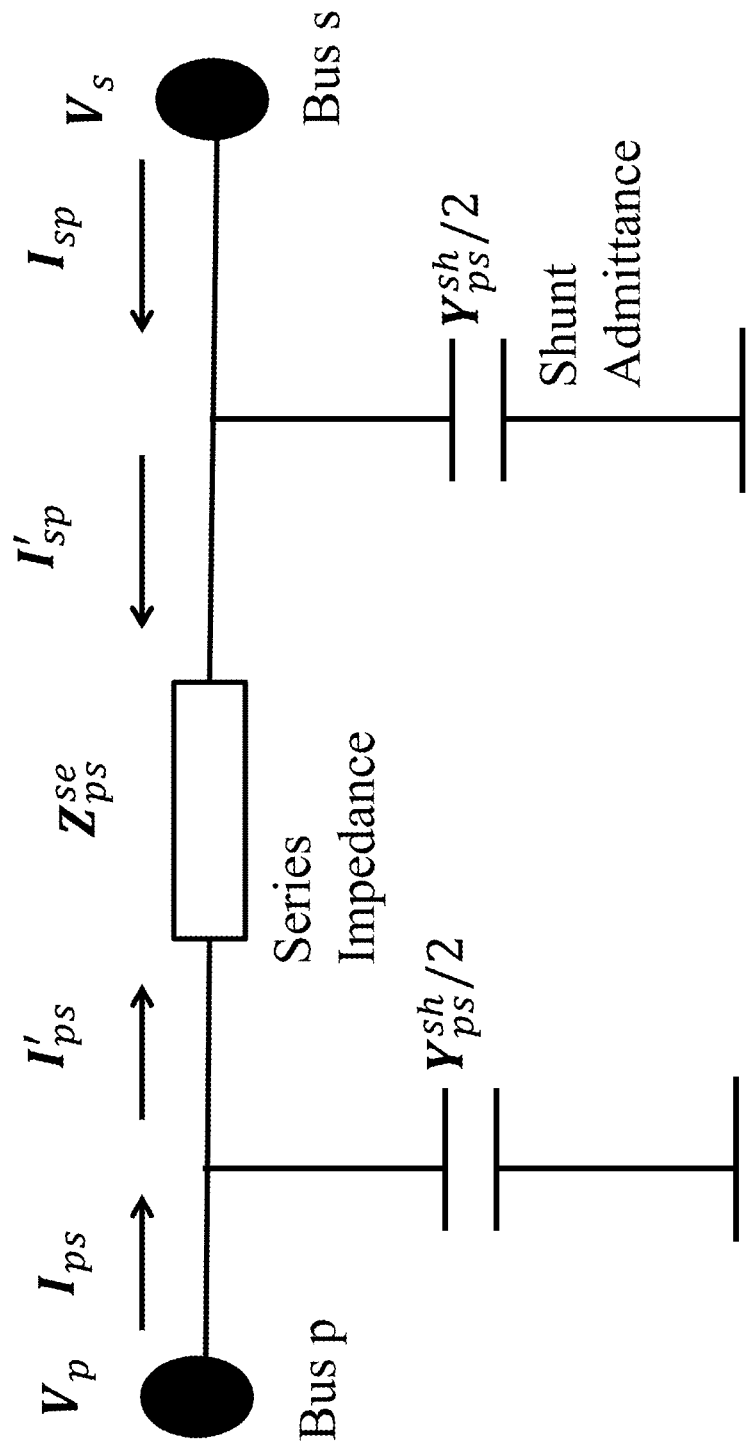
FIG. 4B is a schematic illustrating $\pi$-model for a distribution line in a power distribution system, according to some embodiments of the present disclosure.

FIG. 4B is a schematic illustrating π-model for a distribution line in a power distribution system, according to some embodiments of the present disclosure.

Specifically, FIG. 4B illustrates a rt-model for a distribution line between bus p and s. In FIG. 4B, $Z_{ps}^{se}$ is its series impedance matrix and $Y_{ps}^{sh}$ is its shunt admittance matrix. The internal currents, $I'_{ps}$ and $I'_{sp}$ directly flow through the series impedances $Z_{ps}^{se}$, and the actual branch currents $I_{ps}$ and $I_{sp}$ are determined by adding the charging currents contributed by shunt admittances $Y_{ps}^{sh}$ into internal currents $I'_{ps}$ and $I'_{sp}$. For the distribution line, the self and mutual admittance matrices used to determine equivalent nodal conductance and susceptance matrices are set as: $Y_{pp}=Y_{ss}=(Z_{ps}^{se})^{-1}+Y_{ps}^{sh}/2$, and $Y_{ps}=Y_{ssp}=(Z_{ps}^{se})^{-1}$, wherein $(\bullet)^{-1}$ stands for the inversion of a matrix.

The equivalent nodal conductance and susceptance matrices for a transformer is determined according to transformer tap ratios, series impedances and winding connection for the transformer.

Still referring to FIG. 4B, for zero-impedance branches, such as voltage regulators, switches, and circuit breakers, those branches are merged into adjacent impedance branches to be modeled. The equivalent nodal conductance and susceptance matrices for a branch combined a regulator with a downstream distribution line is determined according to a set of regulation ratios of the regulator and a series impedance matrix and a shunt admittance matrix of the distribution line.

Figure 4C:
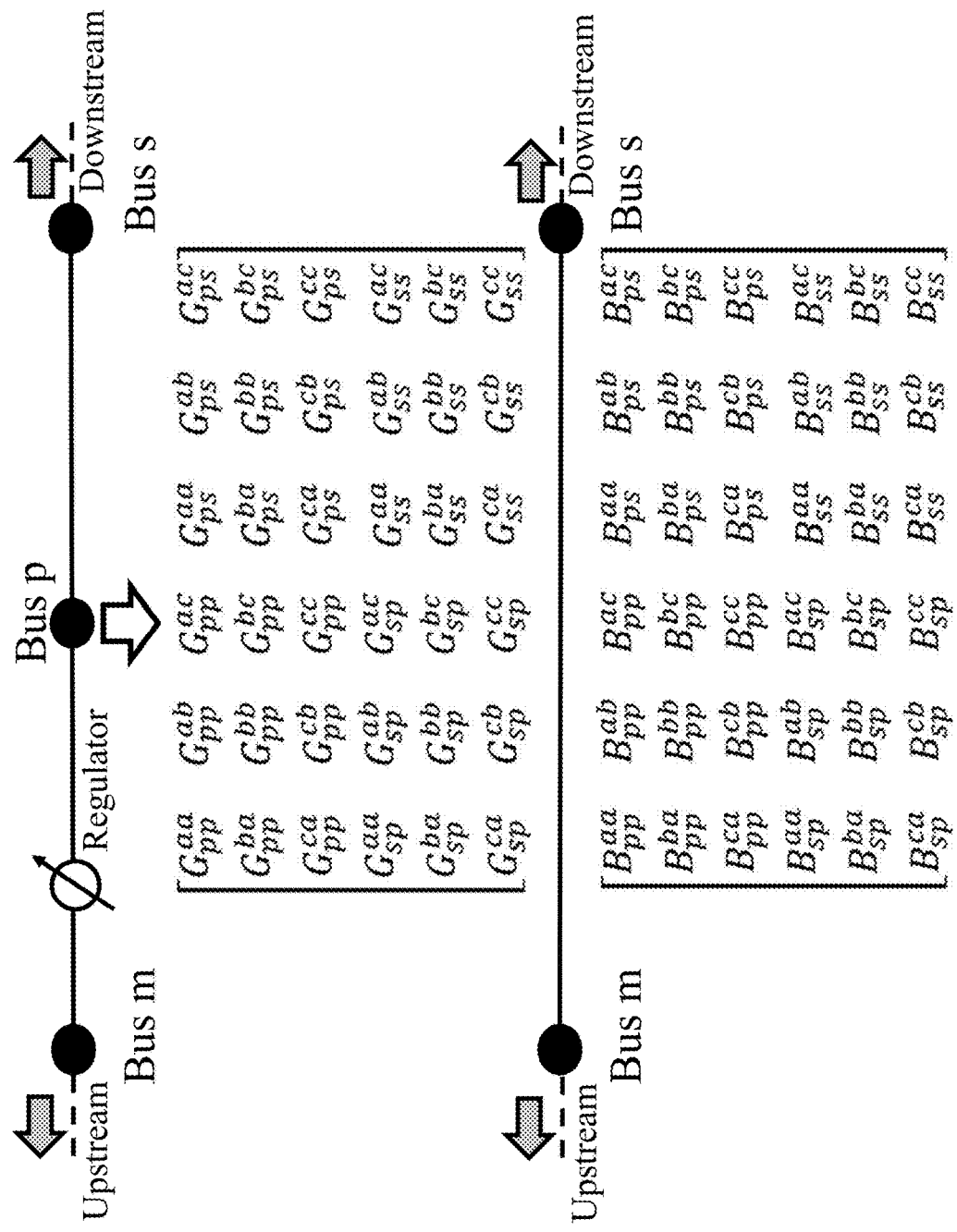
FIG. 4C is a schematic illustrating link features for an equivalent branch combing a voltage regulator with a downstream distribution line in a power distribution system, according to some embodiments of the present disclosure.

FIG. 4C is a schematic illustrating link features for an equivalent branch combing a voltage regulator with a downstream distribution line in a power distribution system, according to some embodiments of the present disclosure. Specifically, FIG. 4C illustrates a set of branch features defined for a voltage regulator branch between bus m and bus p connected with a line branch between bus p and bus s. The two branches are merged into an equivalent branch between bus m and bus s. The parameters for the equivalent branch between bus m and bus s include ($G_{pp}^{xy}$, $B_{pp}^{xy}$, $G_{ps}^{xy}$, $B_{ps}^{xy}$, $G_{sp}^{xy}$, $B_{sp}^{xy}$, $G_{ss}^{xy}$, $B_{ss}^{xy}$, xy∈{aa, ab, ac, ba, bb, bc, ca, cb, cc}).

Figure 4D:
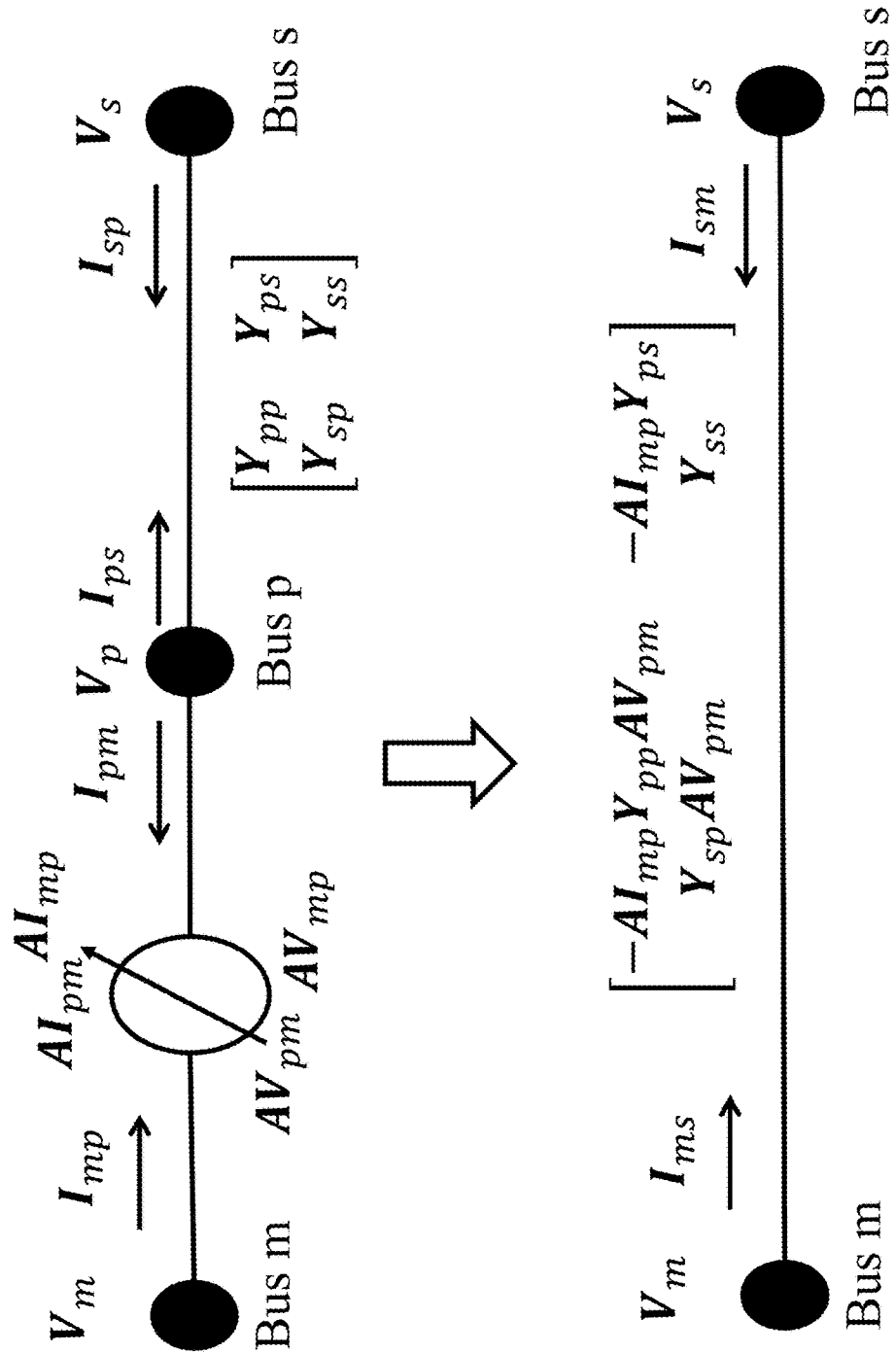
FIG. 4D is a schematic illustrating some parameters of an equivalent branch that combined a voltage regulator with a downstream distribution line in a power distribution system, according to some embodiments of the present disclosure.

FIG. 4D is a schematic illustrating some parameters of an equivalent branch that combined a voltage regulator with a downstream distribution line in a power distribution system, according to some embodiments of the present disclosure. Specifically, FIG. 4D illustrates the equivalent model for a voltage regulator branch merged into an adjacent impedance branch. The voltage regulator is fully represented by two current amplifying factor matrices, $AI_{mp}$ and $AI_{pm}$, and two voltage amplifying factor matrices, $AV_{mp}$ and $AV_{pm}$. $I_{mp}=AI_{mp}I_{pm}$, $I_{pm}=AI_{pm}I_{mp}$, $I_{mp}$ and $I_{pm}$ are the phase currents entering through bus m and bus p, respectively. $V_m=AV_{mp}V_p$, $V_p=AV_{pm}V_m$, $V_m$ and $V_m$ are the phase voltages of bus m and bus p, respectively. Those amplifying factor matrices are determined by the winding connection and tap positions for the voltage regulator. The impedance branch between bus p and bus s is fully represented by two self-admittance matrices $Y_{pp}$ and $Y_{ss}$ at bus p and bus s, and two mutual admittance matrices between bus p nad bus s, $Y_{ps}$ and $Y_{sp}$. For the equivalent branch between bus m and bus s, the branch currents and nodal voltages are related as:

$$\begin{bmatrix} I_{ms} \\ I_{sm} \end{bmatrix} = \begin{bmatrix} -AI_{mp}Y_{pp}AV_{pm} & -AI_{mp}Y_{ps} \\ Y_{sp}AV_{pm} & Y_{ss} \end{bmatrix}\begin{bmatrix} V_m \\ V_s \end{bmatrix} \quad (4)$$

wherein $I_{ms}$ and $I_{sm}$ are the vectors of phase currents flowing through bus m and bus s, and $V_s$ is the vector of phase voltages at bus s. If the voltage amplifying matrices of the voltage regulator are given in terms of line-to-line voltages (i.e. phase-to-phase voltages), the branch currents and nodal voltages are related as:

$$\begin{bmatrix} I_{ms} \\ I_{sm} \end{bmatrix} = \begin{bmatrix} -AI_{mp}Y_{pp}CV^{PL}CV_{pm}^{LL}CV^{LP} & -AI_{mp}Y_{ps} \\ Y_{sp}CV^{PL}CV_{pm}^{LL}CV^{LP} & Y_{ss} \end{bmatrix}\begin{bmatrix} V_m \\ V_s \end{bmatrix} \quad (5)$$

$CV^{LP}$ is a voltage conversion factor matrix that converted phase-to-ground voltages into phase-to-phase voltages, $$CV^{LP} = \begin{bmatrix} 1 & -1 & 0 \\ 0 & 1 & -1 \\ -1 & 0 & 1 \end{bmatrix}.$$

$CV^{PL}$ is a voltage conversion factor matrix that converted phase-to-phase voltages into phase-to-ground voltages, $$CV^{PL} = \begin{bmatrix} 1/3 & 0 & -1/3 \\ -1/3 & 1/3 & 0 \\ 0 & -1/3 & 1/3 \end{bmatrix}.$$

The equivalent nodal conductance and susceptance matrices for a branch combined a switch or breaker with a downstream distribution line is determined according to a set of energized statuses for all phases of the switch or breaker and a series impedance matrix and a shunt admittance matrix of the distribution line.

Figure 4E:
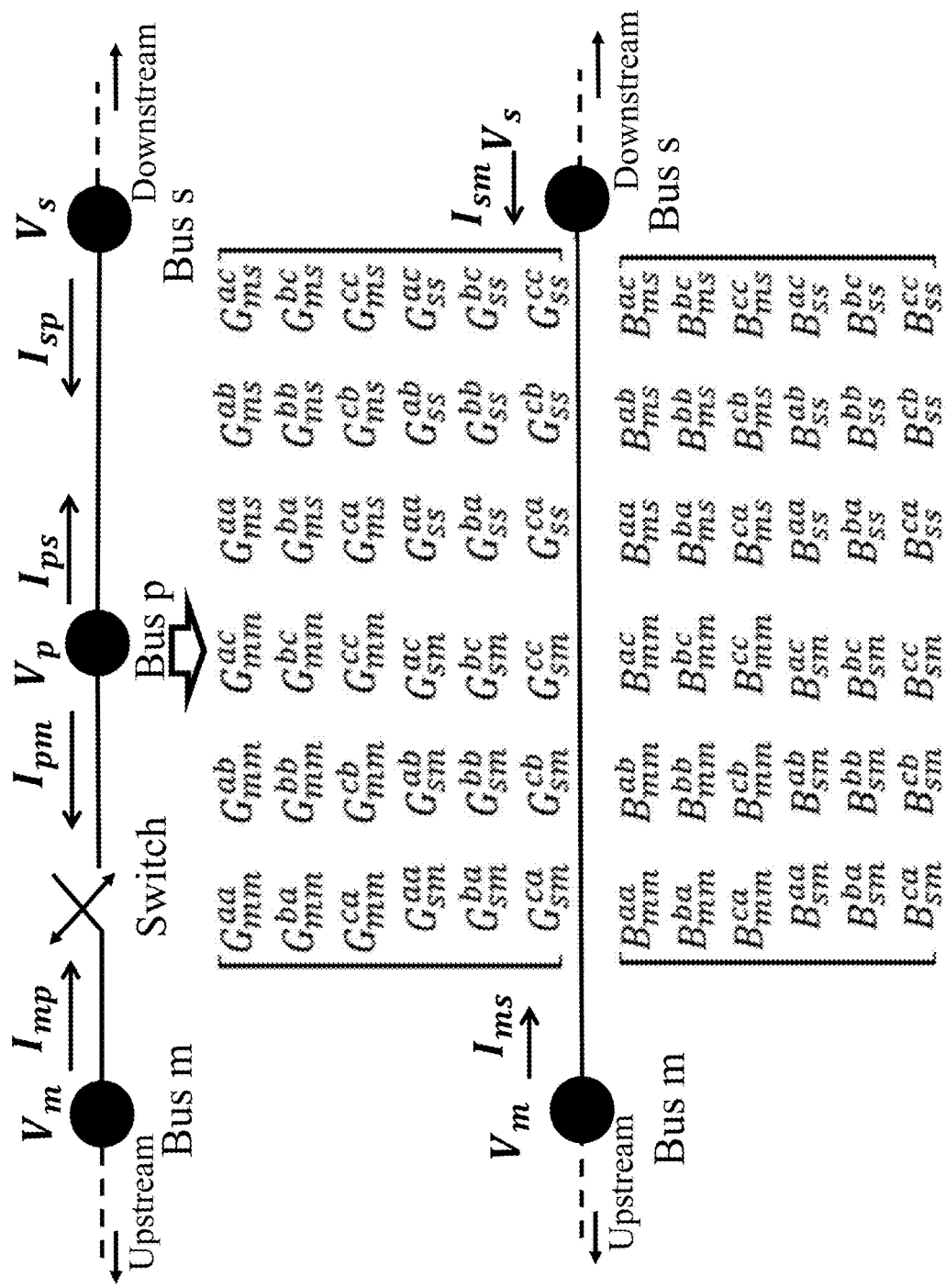
FIG. 4E is a schematic illustrating link features for an equivalent branch combing a switch or breaker with a downstream distribution line in a power distribution system, according to some embodiments of the present disclosure.

FIG. 4E is a schematic illustrating link features for an equivalent branch combing a switch or breaker with a downstream distribution line in a power distribution system, according to some embodiments of the present disclosure. Specifically, FIG. 4E illustrates a set of branch features defined for a switch/breaker between bus m and bus p connected with a line branch between bus p and bus s. The two branches are merged into an equivalent branch between bus m and bus s. The parameters for the equivalent branch between bus m and bus s include ($G_{pp}^{xy}$, $B_{pp}^{xy}$, $G_{ps}^{xy}$, $B_{ps}^{xy}$, $G_{sp}^{xy}$, $B_{sp}^{xy}$, $G_{ss}^{xy}$, $B_{ss}^{xy}$, xy∈{aa, ab, ac, ba, bb, bc, ca, cb, cc}).

The switch branch between bus m and bus p is represented by a phase energized status matrix:

$$S_{mp} = \begin{bmatrix} S_{mp}^a & 0 & 0 \\ 0 & S_{mp}^b & 0 \\ 0 & 0 & S_{mp}^c \end{bmatrix} \quad (6)$$

wherein $S_{mp}^x$ stands for energized status for phase x, x∈{a, b, c}. $S_{mp}^x$ equals to 1 if energized, otherwise equals to zero. The merged branch current $I_{ms}$ flowing through bus m and bus s relates to the original branch current $I_{ps}$ flowing through bus p to bus s as:

$$I_{ms}=S_{mp}I_{ps} \quad (7)$$

Still referring to FIG. 4E, the voltages at bus p can be represented using voltages at bus m and bus s as:

$$V_p=S_{mp}V_m+(I-S_{mp})V_s \quad (8)$$

Therefore, the currents for the combined branch between bus m and bus s, $I_{ms}$ and $I_{sm}$ relates the phase voltages, $V_m$ and $V_s$ as:

$$\begin{bmatrix} I_{ms} \\ I_{sm} \end{bmatrix} = Y^{eqv} \begin{bmatrix} V_m \\ V_s \end{bmatrix} \quad (9)$$

wherein, $Y^{eqv}$ equivalent nodal admittance defined by the energized status matrix for the switch, $S_{mp}$ and self and mutual admittances for the impedance branch between bus p and bus s, $Y_{pp}$ and $Y_{ss}$, $Y_{ps}$ and $Y_{sp}$, according to:

$$Y^{eqv} = \begin{bmatrix} S_{mp}Y_{pp} & S_{mp}V_{ps} \\ S_{mp}Y_{sp} & (I - S_{mp})Y_{sp} + Y_{ss} \end{bmatrix} \quad (10)$$

Still referring to FIG. 4E, the node features, branch features and output features are normalized before using for facilitating migrations to other systems with different topologies.

The fault locations are modeled as output features of nodes. There are many ways to define node output features representing the fault conditions. The output features can be represented using either real numbers as shown in FIG. 5A and FIG. 5B, or binary numbers as shown in FIG. 5C.

Figure 5A:
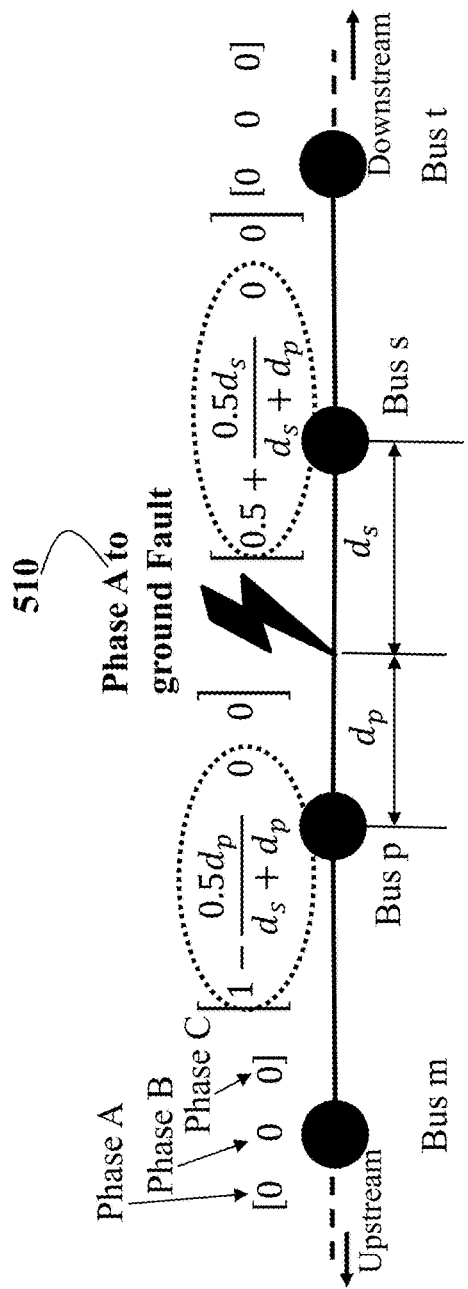
FIG. 5A is a schematic illustrating some output features representing fault locations for buses in a power distribution system, in which each bus has one independent feature for each phase, according to some embodiments of the present disclosure.
Figure 5B:
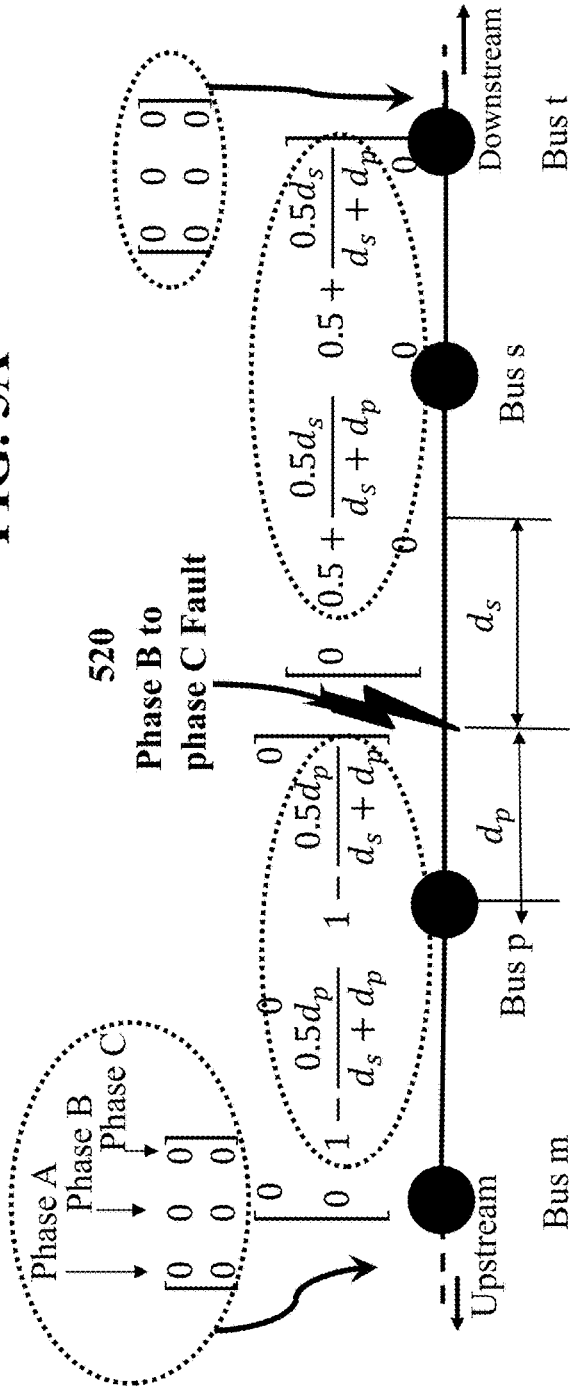
FIG. 5B is a schematic illustrating some output features representing fault locations for buses in a power distribution system, in which each bus defined two independent features for each phase, according to some embodiments of the present disclosure.
Figure 5C:
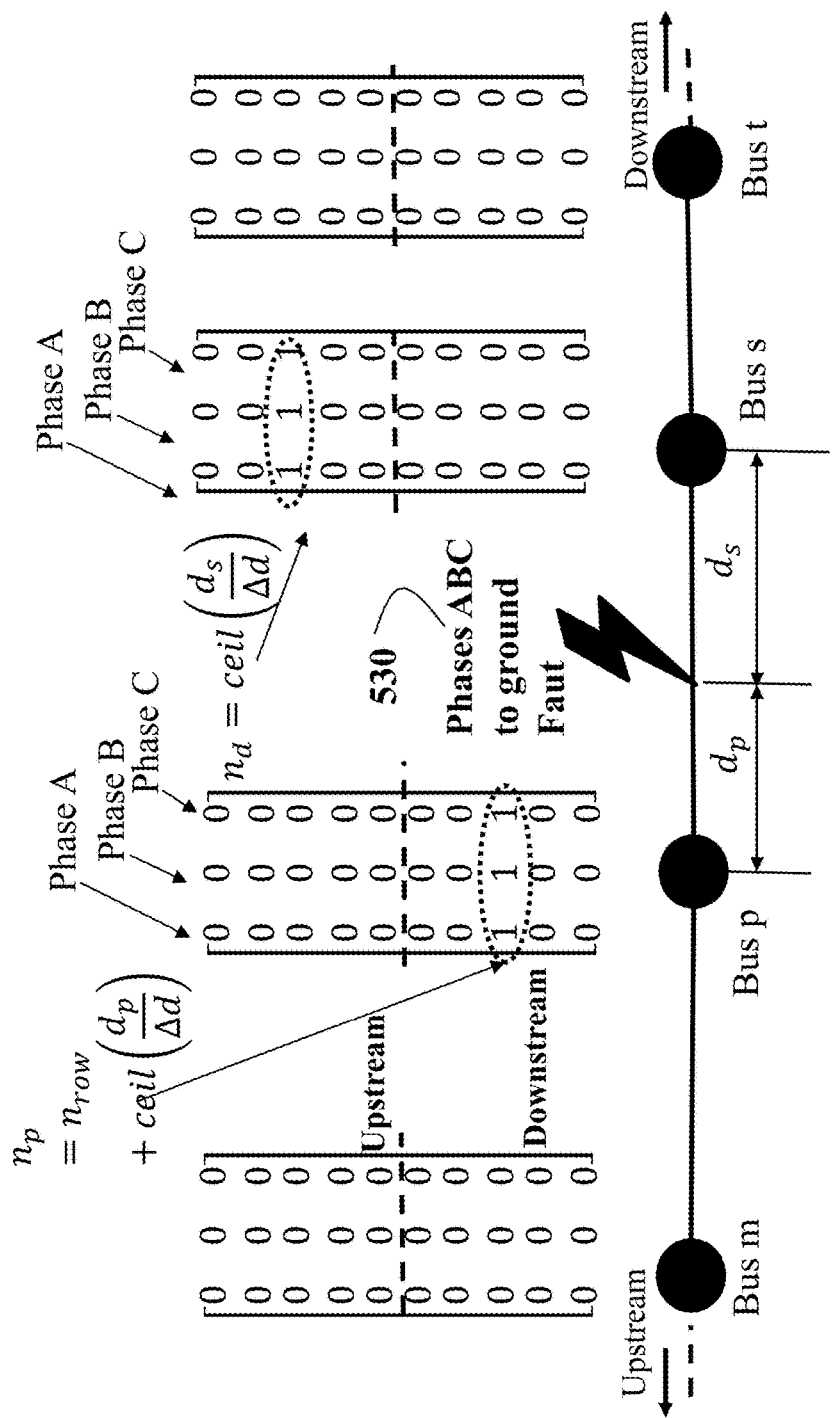
FIG. 5C is a schematic illustrating some output features representing fault locations for buses in a power distribution system, in which each bus defined a set of binary independent features for each phase, according to some embodiments of the present disclosure.

FIG. 5A is a schematic illustrating some output features representing fault locations for buses in a power distribution system, in which each bus has one independent feature for each phase, according to some embodiments of the present disclosure. For example, each bus has a row vector with dimensions of 1×3 is used to define the fault location related information, in which each phase of the bus has a corresponding element to describe whether there is a fault in this phase, and how far from this bus. Only terminal buses of a branch having a fault have non-zero output features residing only at faulted phases of the buses. Any bus p has 3 output features one phase each, $(o_p^x, x\in\{a, b, c\})\in \mathbb{R}^3$, and the output features of the system can be represented as $Z\in \mathbb{R}^{n\times 3}$, where n is the number of buses to be considered.

In FIG. 5A, a fault occurs on the branch between bus p and bus s. Only terminal buses of faulted branch, i.e., bus p and bus s, have non-zero elements in their output feature vectors. For all other buses, for examples, bus in and bus t, the values of output features are set as zero. For the terminal buses of faulted branch, only the elements corresponding to faulted phases are set with non-zero values in their output feature vectors. The magnitudes of output features for fault phases on the terminal buses of faulted branch are determined based on the relative distance from the fault spot to the bus, and the fault is at the upstream or downstream direction to the bus. The upstream and downstream directions are determined by comparing the distances to the substation of the distribution system. For a pair of buses, the ones close to the substation is regarded as upstream bus, and the other as downstream bus.

For example, in FIG. 5A, a phase A to ground fault 510 occurred at the line between bus p and s. Bus p is the upstream bus, and Bus s is the downstream bus. $d_p$ and $d_s$ are the distances from the fault location to bus p and bus s, respectively. Therefore, the output features for bus p are set as $$\begin{bmatrix} 1 - \dfrac{0.5d_p}{d_s + d_p} & 0 & 0 \end{bmatrix},$$

and the output features for bus s are $$\begin{bmatrix} 0.5 + \dfrac{0.5d_s}{d_s + d_p} & 0 & 0 \end{bmatrix}.$$

wherein only the output features corresponding to fault phase A have non-zero values.

For a known fault event, given the fault branch, fault location and fault phases, we can determine output features for all busses accordingly. Therefore, a full set of output features, and node features and branch features for the event can be obtained and served as a training sample for learning a relationship between output features and node and branch features.

Still referring to FIG. 5A, for an unknown fault event, if we can estimate the output features with given node and branch features. Then we can determine the fault branch, fault location and fault phases accordingly. The fault branch is determined as a branch that has non-zero output features on both terminal buses. The fault phases are the phases of one of terminal buses of the faulted branch that have non-zero output features. The fault location is determined by using a ratio of distance from fault spot to the upstream bus over length of the branch. Taken a fault branch between bus p and bus s as an example, $s_{ph}$ is the set of faulted phases, and bus p is the upstream bus. The ratio of distance between fault spot to upstream bus p over length of the branch, $\alpha_p$ is determined as:

$$\alpha_p = \dfrac{\sum_{x\in s_{ph}} (2.0 - \hat{o}_p^x - \hat{o}_s^x)}{\|s_{ph}\|} \quad (11)$$

wherein $\|\cdot\|$ is the cardinality of a set, $\hat{o}_{pp}^x$ and $\hat{o}_s^x$ are the estimated output features corresponding to faulted phase x of bus p and bus s, respectively.

FIG. 5B is a schematic illustrating some output features representing fault locations for buses in a power distribution system, in which each bus defined two independent features for each phase, according to some embodiments of the present disclosure. Specifically, FIG. 5B illustrates defining fault conditions as output features for buses using a matrix with dimensions of 2×3 for each bus. Any bus p uses 6 output features to describe its fault related information for the bus, $(o_p^{UP-x}, o_p^{DN-x}, x\in\{a, b, c\})\in \mathbb{R}^6$. The elements of first row of output features, $(o_p^{UP-x}, x\in\{a, b, c\})$ may have non-zero values if a fault occurs upstream to the bus on some of phases, and the magnitudes of non-zero values are related to the distance between fault location to the bus. Similarly, the elements, $(o_p^{DN-x}, x\in\{a, b, c\})$ of second row of output features for bus p have non-zero values if a fault occurs downstream to the bus on some phases, and the values are related to the distance between fault location to the bus. The output features of the system can be represented as $Z\in \mathbb{R}^{n\times 6}$, where n is the number of buses to be considered.

Referring to FIG. 5B, a phase-to-phase fault 520 occurred between phase B and phase C on the line between bus p and bus s. Bus p is the upstream bus, and bus s is the downstream bus. $d_p$ and $d_s$ are the distances from the fault location to bus p and bus s, respectively. Therefore, the output features for bus p are set as $$\begin{bmatrix} 0 & 0 & 0 \\ 0 & 1 - \dfrac{0.5d_p}{d_s + d_p} & 1 - \dfrac{0.5d_p}{d_s + d_p} \end{bmatrix},$$

since the fault is downstream to bus p. The output features for bus s are $$\begin{bmatrix} 0 & 0.5 + \dfrac{0.5d_s}{d_s + d_p} & 0.5 + \dfrac{0.5d_s}{d_s + d_p} \\ 0 & 0 & 0 \end{bmatrix},$$

since the fault is upstream to bus s. Only the output features corresponding to fault phases B and C have non-zero values.

Still referring to FIG. 5B, for the unknown fault, the fault type and location can be determined if corresponding estimations of output features are given. Taken a fault branch between bus p and bus s as an example, $s_{ph}$ is the set of faulted phases, and bus p is the upstream bus. The ratio of distance between fault spot to upstream bus p over length of the branch, $\alpha_p$ is determined as:

$$\alpha_p = \dfrac{\sum_{x \in s_{ph}} (2.0 - \hat{o}_p^{DN-x} - \hat{o}_s^{UP-x})}{\|s_{ph}\|} \quad (12)$$

wherein $\|\cdot\|$ is the cardinality of a set, $\hat{o}_{pp}^{DN-x}$ and $\hat{o}_s^{UP-x}$ are the estimated output features corresponding to faulted phase x of bus p and bus s, respectively.

FIG. 5C is a schematic illustrating some output features representing fault locations for buses in a power distribution system, in which each bus defined a set of binary independent features for each phase, according to some embodiments of the present disclosure. Specifically, FIG. 5C illustrates defining fault conditions as output features for each node using a matrix with dimensions of $2n_{row} \times 3$. Each branch is divided into $n_{row}$ sections, and each section corresponds a range of locations between two terminal buses. If the number of sections is big enough, we can get relatively accurate results by prediction a fault occurring within which section instead of the actual spot location. For each bus p, the first $n_{row}$ rows of the output feature matrix indicates whether a fault is occurring upstream to bus p, and if occurred at which section and which phases of the upstream branch. Similarly, the last $n_{row}$ rows of the output feature matrix indicates whether a fault is occurring downstream to bus p, and if occurred at which section and which phases of the downstream branch. For any bus p, it has $6n_{row}$ output features, including $(b_{p-r}^{UP-x}, b_{p-r}^{DN-x}, x \in \{a, b, c\}, r \in \{1, \ldots, n_{row}\}) \in \mathbb{R}^{6n_{row}}$. The elements, $(b_{p=r}^{UP-x}, x \in \{a, b, c\})$ of first $n_{row}$ rows of output features for the bus have values of 1 if a fault occurs upstream to the bus, and located in the r-th section of an upstream branch on phase x. Similarly, the elements, $(b_{p-r}^{DN-x}, x \in \{a, b, c\})$ of second $n_{row}$ rows of output features for the bus have values of 1 if a fault occurs downstream to the bus, and is located in r-th section of a downstream branch on phase x. Therefore, the output features of the system can be represented as $Z \in \mathbb{R}^{n \times 6n_{row}}$, where n is the number of buses to be considered, and $n_{row}$ is the number of branch sections.

Still referring to FIG. 5C, a triple-phase to ground fault 530 occurred among phases A, B and C at the line between bus p and s. Bus p is upstream to bus s. $d_p$ and $d_s$ are the distances from the fault location to bus p and bus s, respectively. All buses, except bus p and bus s have an output feature matrix with all zero elements. Bus p is the upstream bus for the fault branch between bus p and bus s. Therefore, the elements of output feature matrix of bus p at all columns of row $n_p$ are set as 1, $n_p$ represents the location of fault section along the branch with respect to bus p, and is determined according the relative distance from fault location to bus p, according to:

$$n_p = n_{row} + \text{ceil}\left(\dfrac{d_p}{\Delta d}\right) \quad (13)$$

wherein ceil(•) rounds a number up to the next largest integer, $\Delta d$ is the length of section of branch between bus p and bus s. Meanwhile, bus s is the downstream bus for the fault branch between bus p and bus s. Then, elements of output feature matrix of bus s at all columns of row $n_s$ are set as 1, $n_s$ represents the location of fault section along the branch with respect to bus s, and is determined according the relative distance from fault location to bus p, according to:

$$n_s = \text{ceil}\left(\dfrac{d_s}{\Delta d}\right) \quad (14)$$

Still referring to FIG. 5C, for the unknown fault, the fault type and location can be determined if corresponding estimations of output features are given. Taken a fault branch between bus p and bus s as an example, $s_{ph}$ is the set of faulted phases, and bus p is the upstream bus. The spot is estimated to locate at the $s_p$-th section from bus p toward bus s, and $s_p$ is estimated as:

$$s_p = \dfrac{\text{ceil}\left(\sum_{x \in s_{ph}} (\hat{n}_p^x + \hat{n}_s^x)\right)}{2\|s_{ph}\|} \quad (15)$$

wherein $\hat{n}_p^x$ and $\hat{n}_s^x$ are the indices of rows of estimated output features that have elements with value 1 at the columns corresponding to phase x of bus p and bus s, respectively. The actual fault spot can be approximated using the mid-point of $s_p$-th section from bus p toward bus s, and then the ratio of distance between fault spot to upstream bus p over length of the branch, $\alpha_p$ is determined as:

$$\alpha_p = \dfrac{2s_p - 1.0}{2n_{row}} \quad (16)$$

Based on the node features, branch features and output features defined above, we can formulate the fault location task as a multiple non-linear regression problem if fault locations are represented as output features using real numbers, or multiple-class classification problem if locations are represented using binary numbers. More specifically, given a matrix of sample node features $X^{(s)}$, and a matrix of sample branch features $Y^{(s)}$, the vector/matrix of sample fault location $Z^{(s)}$, is obtained by $Z^{(s)} = f(X^{(s)}, Y^{(s)})$, where f is a specific faulty location regression/classification model, s is the index for the sample fault event. The fault location vector $Z^{(s)}$ defines the fault indications for all buses, in which the terminal buses for fault branches are set with non-zero real/binary values on faulted phases in which the non-zero values are related to the distance between the fault spot and corresponding bus. A fault is correctly located if $\tilde{Z}^{(s)}=Z^{(s)}$, where $Z^{(s)}$ indicates the true fault location, and $\tilde{Z}^{(s)}$ is the estimated fault location corresponding to $X^{(s)}$ and $Y^{(s)}$.

The present disclosure can include a graph neural network (GNN) that is used to map the relationship between the fault locations with bus features and branch features of the power distribution system. The graph processing layers with combined node and link attributes are used to map system topology, bus measurements and branch parameters into hidden node embeddings, and full-connected dense layers are used to relevant fault locations to hidden node embeddings. As shown in FIG. 3A, and FIG. 3B, the node attributes of the graph include measured voltages and currents. The equivalent nodal conductance and susceptance matrices generated based on branch impedance/admittance and regulation parameters are integrated into link attributes of the graph, as shown in FIG.s 4A-4E. As shown in FIG.s 5A-5C, the fault locations are represented as node output features in term of real or binary numbers of the graph. This graph neural network is applicable to various fault types, including single phase to ground fault, double phase to ground fault, phase to phase fault, and three-phase fault.

Figure 6:
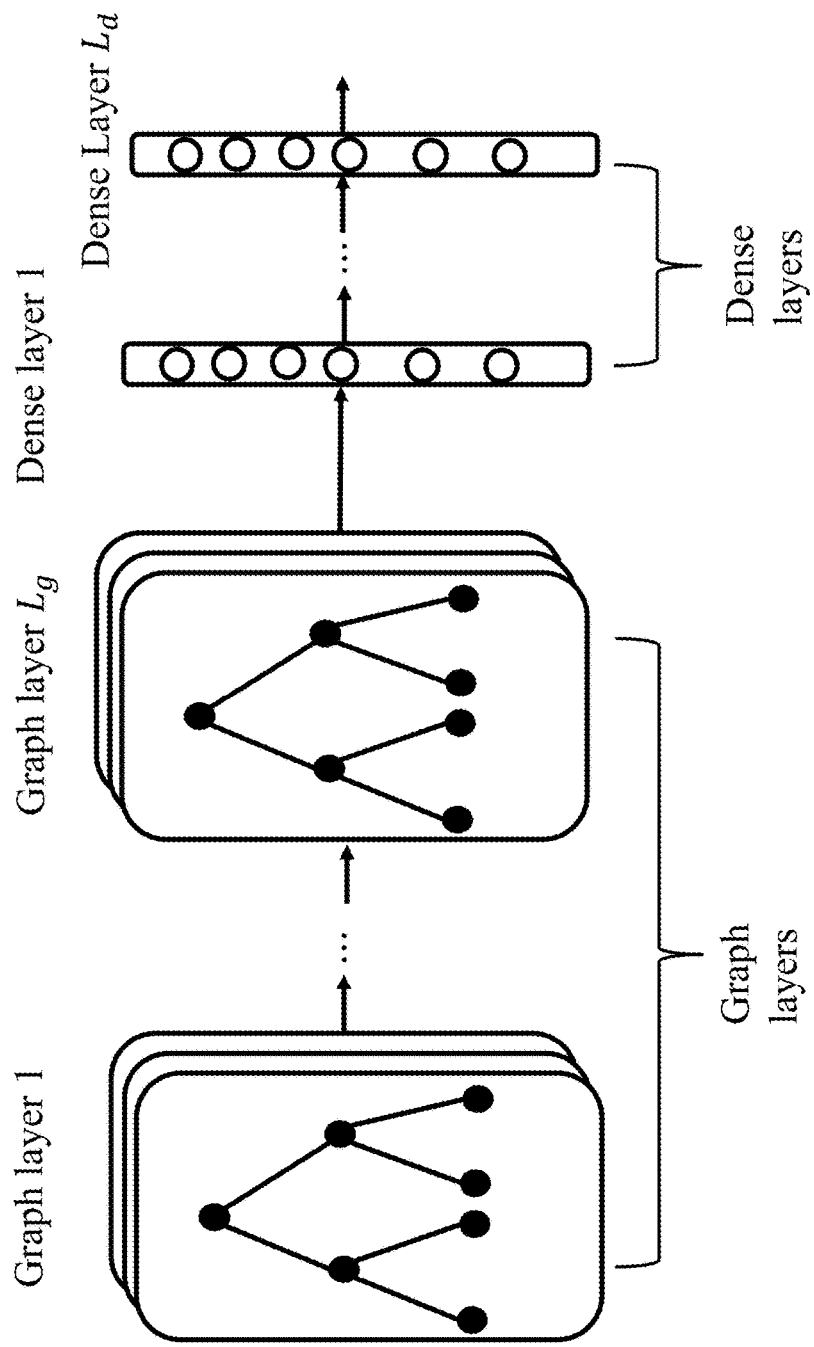
FIG. 6 is a schematic illustrating a configuration for a graph neural network that used for fault detection and location of a power distribution system, according to some embodiments of the present disclosure.

FIG. 6 is a schematic illustrating a configuration for a graph neural network that used for fault detection and location of a power distribution system, according to some embodiments of the present disclosure. Specifically, FIG. 6 illustrates the structure of GNN model that applied to the fault location task. It includes several graph processing layers followed by several fully-connected dense layers. The inputs X and Y is passed through $L_g$ graph processing layers and $L_d$ fully-connected dense layers followed by nonlinear activation functions. The sigmoid function is used for a regression model, and the Softmax function is used for a classification model. The weights and biases for graph processing layers and full-connected layers are optimized by minimizing a loss function defined as the Squared Error loss of output features for the regression model, and Cross-Entropy loss of output features for the classification model. The Adam optimizer is used to train the model.

For a given distribution system, normal and faulty cases are simulated for each branch in the system to generate the training and test datasets used for training and evaluating the fault location models. The types of faults include single phase to ground fault, double phase to ground fault, phase to phase fault, and three phase to ground fault, and phase-to-phase-to-phase fault. The different fault locations for each branch, different fault resistances for each fault, and different load levels for the system are simulated. The voltage and current phasors are measured during the fault.

Still referring to FIG. 6, for the implementation of the GNN model, X include measurements for all buses. For the non-measured buses, we set the corresponding values to be zero. Y include parameters for all branches. For the switch or regulator branch, it is merged with a downstream branch to be considered, the parameters Y of the merged branch are determined based on impedance and admittance of the downstream branch, and energization/regulation settings for the regulator and switch, wherein the branch is directly connected to the switch or regulator downstream. In addition, the intermediate bus between the regulator or switch branch and the downstream branch is ignored, and its node feature is not considered.

The GNN model used is an extended Graph Convolutional Network model. A Graph Convolutional Network (GCN) has proved to be a powerful architecture in aggregating local neighborhood information for individual graph nodes. Low-rank proximities and node features are successfully leveraged in existing GCNs, however, attributes that graph links may carry are commonly ignored, as almost all of these models simplify graph links into binary or scalar values describing node connectedness. In comparison, the extended GCN model used takes both node and link attributes as inputs.

Figure 7:
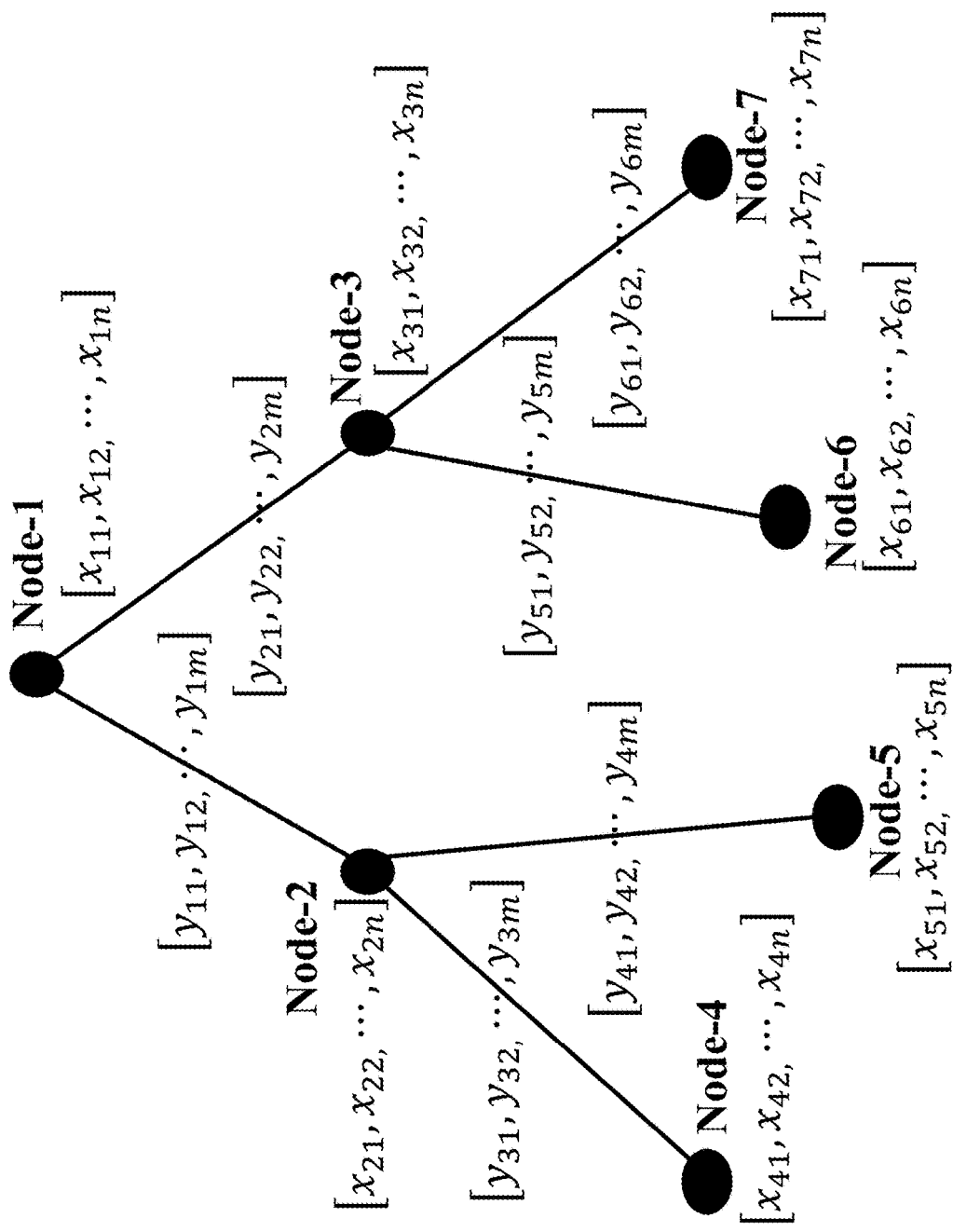
FIG. 7 is a schematic illustrating a graph described by both node and link attributes that used to represent a power distribution system, according to some embodiments of the present disclosure.

FIG. 7 is a schematic illustrating a graph described by both node and link attributes that used to represent a power distribution system, according to some embodiments of the present disclosure. Specifically, FIG. 7 shows each node having a set of attributes to describe its features using a row vector, and each branch also has a set of its own attributes to describe its features as a row vector. For adequately capturing the interactions between link and node attributes, the neighbor features of nodes can be defined as a tensor product of link attributes and corresponding node attributes.

Suppose an undirected weighted graph G=(V, E) is used to describe a distribution system, where V is the set of nodes, E is the set of links. A neighbor can be described as an ordered pair, containing a neighbor node and the link connecting it to the central node, i.e. (node, link). In order to capture the interactions within a (node, link) neighbor and adequately incorporate link attributes into node hidden representations, the associated neighbor feature is defined using their tensor product, instead of simply adding or concatenating node and link attributes together. Tensor product of two vectors a and b is calculated as $ab^T$ with shape $d_a \times d_b$, and $d_a$ and $d_b$ are the lengths of a and b. The calculated tensor contains all bilinear combinations of the two attributes, and serves as a fully conjoined feature. Formally, for the central node u connected to node v by a link $e_{u,v}$, the corresponding neighbor feature is defined as:

$$f((v, e_{u,v})) := f(v) \otimes f(e_{u,v}) \quad (17)$$

where u and v are nodes in G, $e_{u,v}$ is a link from node u to node v. $\otimes$ stands for the operation of tensor product. $f(\cdot)$ is the feature of a node, a link or a pair, $(v, e_{u,v})$ is a neighbor of node u, i,e, a pair of node v and link $e_{u,v}$.

Still referring to FIG. 7, instead of directly using the tensor as inputs that leads to unacceptably high dimensionalities and heavy redundancies, graph kernels for so-defined neighbor features are used. For two neighbors, $(v, e_{\cdot,v})$ and $(w, e_{\cdot,w})$, the neighbor kernel is defined as the inner product of the neighbor tensors, i.e.

$$\mathcal{K}_{((v, e_{\cdot,v}), (w, e_{\cdot,w}))} := \langle f((v, e_{\cdot,v})), f((w, e_{\cdot,w}))\rangle = \langle f(v), f(w)\rangle \langle \cdot \rangle f(e_{\cdot,v}), f(e_{\cdot,w}) \rangle \quad (18)$$

$\langle , \rangle$ stands for the operation of inner product.

Based on the neighbor kernel, a kernel of two 1-hop neighborhoods with central node u and u' can be defined as (19)

$$\mathcal{K}_N^{(l)}(u, u') := \begin{cases} \langle f(u), f(u')\rangle & l=0 \\ \langle f(u), f(u')\rangle \cdot \lambda \cdot \sum_{v \in N(u)} \sum_{v' \in N(u')} \mathcal{K}_N^{(l-1)}(v, v') \cdot \langle f(e_{u,v}), f(e_{u',v'})\rangle & l>0 \end{cases}$$

by regarding the lower-hop kernel, $\mathcal{K}_{N(l-1)}(v, v')$, as the inner product of the (l−1)-th hidden representations of v and v'. $\lambda \in [0,1]$ is a decay factor. N(u) is the set of neighbor nodes of u. By recursively applying the neighborhood kernel, a neural architecture for graphs with both node and link attributes, GCN-LASE (i.e. GCN with Link Attributes and Sampling Estimation) can be defined as a graph processing layer as FIG. 8.

Figure 8:
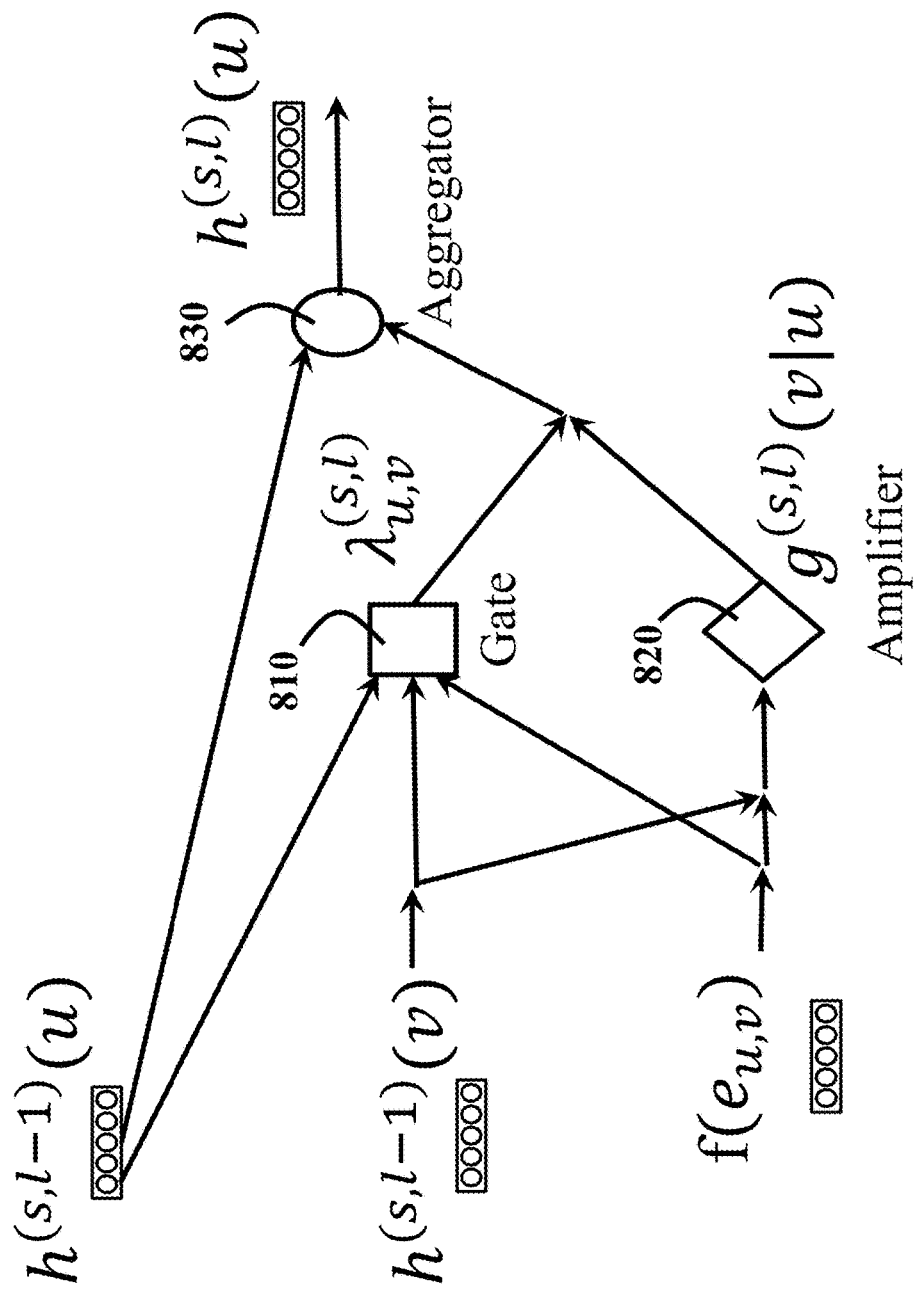
FIG. 8 is a schematic illustrating an architecture of a graph processing layer included in a graph neural network, according to some embodiments of the present disclosure.

FIG. 8 is a schematic illustrating an architecture of a graph processing layer included in a graph neural network, according to some embodiments of the present disclosure. For layer l with corresponding sample s, the forward propagation calculations for the graph processing layer include three components, namely a gate 810, an amplifier 820, and an aggregator 830. The gate $\lambda_{u,v}^{(s,l)}$ 810 evaluates v's influence in u's neighborhood. The amplifier $g^{(s,l)}(v|u)$ 820 amplifies the node attributes using link information element-wisely. The aggregator $h^{(s,l)}(u)$ 830 sums up neighbor embeddings and combines them with the central node embedding. By uniting the depth and breadth convolution of nodes, and referring to the neighborhood aggregation concept in Graph-SAGE, a LASE-SAGE architecture for the given graph processing layer l (l=1, ..., $L_g$), using sample s can be defined as:

$$\lambda_{u,v}^{s,l} = \sigma(WG_{node}^{(l)}h^{(s,l)}(u) + WG_{link}^{(l)}f^{(s)}(e_{u,v}) + WG_{neighbor}^{(l)}h^{(s,l)}(v) + bG^{(l)}) \quad (20)$$

$$h^{(s,0)}(u) = f_{node}^{(s)}(u) \quad (21)$$

$$g^{(s,l)}(v|u) = h^{(s,l-1)}(v) \odot \text{sigmoid}(WA_{link}^{(l)}f_{link}^{(s)}(e_{u,v})) \quad (22)$$

$$g^{(s,l)}(N(u)) = \sum_{v \in N(u)} \lambda_{u,v}^{(s,l)} g^{(s,l)}(v|u) \quad (23)$$

$$h^{(s,l)}(u) = \sigma(WA_{node}^{(l)}h^{(s,l-1)}(u) \oplus WA_{neighbor}^{(l)}g^{(s,l)}(N(u)) + bA^{(l)}) \quad (24)$$

where, $\odot$ is the operation of element-wise product, and $\oplus$ is the operation of concatenating input vectors. $\sigma(\cdot)$ is a nonlinear activation function. The action function is a sigmoid function if a fault location regression model is used, and a SoftMax function if a fault classification model is used. $h^{(s,l)}(u)$ is the hidden representation of node u in layer l. $W_{node}^{(l)}$, $WG_{link}^{(l)}$, $WG_{neighbor}^{(l)}$ and $WA_{node}^{(l)}$, $WA_{link}^{(l)}$, $WA_{neighbor}^{(l)}$ are the weight parameters in the graph neural network.

For each layer l, the above calculation is executed ($L_g$−l+1) times with different depth/hop for neighborhood.

Still referring to FIG. 6, the prediction layers are used to generate output features based on hidden node embeddings, and for the first layer, it takes the hidden node embeddings at last graph layer as input. The output of last prediction layer represents the faut location estimation results. The calculations for prediction layer k (k=1, ..., $L_d$) include:

$$o_u^{(s,0)} = h^{(s,k)}(u) \quad (25)$$

$$o_u^{(s,k)} = \sigma(WP_{node}^{(k)}o_u^{(s,k-1)} + bP^{(k)}) \quad (26)$$

Taken a graph neural network with two graph processing layers and one prediction layers as example, the dimensions of weights and biases for the first graph layer $WG_{node}^{(1)}/WA_{node}^{(1)}$, $WG_{link}^{(1)}/WA_{link}^{(1)}$, $WG_{neighbor}^{(1)}/WA_{neighbor}^{(1)}$ are $(n_{out}^{(1)}, m_{node})$, $(n_{out}^{(1)}, m_{link})$, $(n_{out}^{(1)}, m_{node})$, and the dimension of $bG^{(1)}/bA^{(1)}$ is $n_{out}^{(1)}$, wherein $n_{out}^{(1)}$ is the pre-determined number of node embeddings for first graph processing layer, $m_{node}$ and $m_{link}$ are the numbers of node attributes and branch attributes respectively.

Still referring to FIG. 6, the dimensions of weights and biases for the second graph layer $WG_{node}^{(2)}/WA_{node}^{(2)}$, $WG_{link}^{(2)}/WA_{link}^{(2)}$, $WG_{neighbor}^{(2)}/WA_{neighbor}^{(2)}$ are $(n_{out}^{(2)}, n_{out}^{(1)})$, $(n_{out}^{(2)}, m_{link})$, $(n_{out}^{(2)}, n_{out}^{(1)})$, and the dimension of $bG^{(2)}/bA^{(2)}$ is the pre-determined number of node embeddings for second graph processing layer.

The dimensions of weights and biases for the prediction layer $WP_{node}^{(1)}$ are $(m_{out}, n_{out}^{(2)})$, and the dimension of $bP^{(1)}$ is $m_{out}$, and $m_{out}$ is the number of output features for fault location.

Still referring to FIG. 6, the weights and biases are determined by minimizing a loss function to measure the differences between calculated outputs of last prediction layer and target outputs for a set of training fault location scenarios. Wherein a cross-entropy function is used when the fault location classification model is used:

$$\text{Loss} = \Sigma_{s=1}^{S} \Sigma_u \Sigma_{m=1}^{m_{out}} (-\hat{o}_{u,m}^{(s,L_d)} * \log(o_{u,m}^{(s,L_d)})), \quad (27)$$

and a squared error loss function is used when the fault location regression model is used:

$$\text{Loss} = \Sigma_{s=1}^{S} \Sigma_u \Sigma_{m=1}^{m_{out}} (o_{u,m}^{(s,L_d)} - \hat{o}_{u,m}^{(s,L_d)})^2 \quad (28)$$

Wherein S is the total number of sample fault events, $\hat{o}_{u,m}^{(s,L_d)}$ is the true value for m-th output features of node u for sample fault event s, $o_{u,m}^{(s,L_d)}$ is the prediction value for m-th output features of node u for sample fault event s. The Adam optimization algorithm is employed to implement the loss minimization. Adam optimization is a stochastic gradient descent method that is based on adaptive estimation of first-order and second-order moments.

Still referring to FIG. 6, similar to GCN, scalability is an obvious challenge for GCN-LASE, that is calculating the convolutions demands a recursively expanded neighborhood. For nodes with high degrees, it will quickly cover a large portion of the graph. To control batch scales, the Monte Carlo method is leveraged to estimate the summed neighborhood information by sampling a fixed number of neighbors. The summed neighborhood information is formulated as:

$$g^{(l)}(N(u)) = \sum_{v \in N(u)} \lambda_{u,v}^{(l)} g^{(l)}(v|u) = \mathbb{E}_{p(l)(\cdot|u)} \left[ \frac{\lambda_{u,v}^{(l)} g^{(l)}(v|u)}{p^{(l)}(\cdot|u)} \right] \quad (29)$$

where $p^{(l)}(\cdot|u)$ denotes the sampling probabilities in N(u). We then approximate $g^{(l)}(N(u))$ through estimating the expectation. As the sampling process is always unbiased, we look for the optimal probabilities that minimize the estimation variance. According to the derivations of importance sampling, the sampling probabilities can be determined to minimize sampling variation as:

$$p^{(l)}(v|u) = \frac{\lambda_{u,v}^{(l)} \|g^{(l)}(v|u)\|_2}{\sum_{v \in N(u)} \lambda_{u,v}^{(l)} \|g^{(l)}(v|u)\|_2} \quad (30)$$

where $\|\cdot\|$ is the L2-norm of the vector.

Evaluating the sampling probabilities batch-wisely can be rather inefficient. Under the hypothesis that the network parameters do not dramatically vary from batch to batch, a tradeoff can be made between variance and efficiency by controlling the interval of calculating the optimal distribution. That is, the sampling probabilities for all training nodes are calculated every k batches. Although the calculation may be time-consuming, the batch-averaged time cost will be reduced to 1/k.

Still referring to FIG. 8, to make training time predictable, the set of nodes to be trained is divided into number of batches, and each batch has a fixed number of nodes. To reduce computation burden, and facility model migration to other distribution systems, a fixed number of neighbor samples is considered for each node by randomly chosen from all neighbors of the node under study.

Algorithm 1 gives a procedure for sampling all nodes needed for each hop of each graph processing layer. Minibatch for node, B contains nodes that we want to generate representations for. $N^{(l,k)}$ denotes a deterministic function which specifies a random sample of a node's neighborhood with given number, and we index this function by l and k to denote the fact that the random samples are independent across iterations over l and k. Each set $B^{(l,k)}$ contains the nodes that are needed to compute the representations of nodes at layer l with search depth, k.

---

Algorithm 1 Node sampling Algorithm for graph processing layers

Input: Graph G(V, E)
        Number of graph processing layer $L_g$
        Minibatch for node, B
        Neighborhood sampling function, $N^{(l,k)}(u)$
Output: Set of nodes for generating representation $B^{(l,k)}$
1:    for l = 1, ..., $L_g$ do
2:        $B^{(l,0)} \leftarrow B$
3:        for k = 1, ..., $L_g$ - 1 do
4:            for $u \in B^{(l,k-1)}$ do
5:                $B^{(l,k)} \leftarrow B^{(l,k-1)} \cup N^{(l,k)}(u)$
6:            end for
7:        end for
8:    end for

---

Algorithm 2 gives a procedure for minibatch forward propagation for each depth of each graph processing layer. S is the set of samples. At each search depth, nodes aggregate information from their local neighbors with weighted by link attributes, and as this process iterates, nodes incrementally gain more and more information from further reaches of the graph.

---

Algorithm 2 Forward propogation Algorithm for graph processing layers

Input: Graph G (V, E)
        Number of graph processing layer $L_g$
        Minibatch for node, B
        Neighborhood sampling function, $N^{(l,k)}(u)$
        Set of nodes for generating representation $B^{(l,k)}$
Output: Representations for nodes $h^{(s,l)}(u)$, $u \in B$
1:    set using Equation (21)
2:    for s = 1, ... , S
3:        for l = 1, ..., $L_g$ do
4:            for k = 1, ... , $L_g$ - 1 do
5:                for u E $B^{(l,k-1)}$ do
6:                    generate a given number of neighbors of u, N(u)
6:                    calculate $\lambda_{u,v}^{(s,l)}$ using Eqation (20), $v \in N(u)$
7:                    calculate $g^{(s,l)}(v|u)$ using Equaton (22), $v \in N(u)$
8:                    calculate $p^{(l)}(v|u)$ using Equation (30), $v \in N(u)$
9:                    calculate $g^{(s,l)}(N(u))$ using equation (29)
10:                  calculate $h^{(s,l)}(u)$ using equation (29)
11:               end for
12:           end for
13:       end for
14:    end for

---

Figure 9:
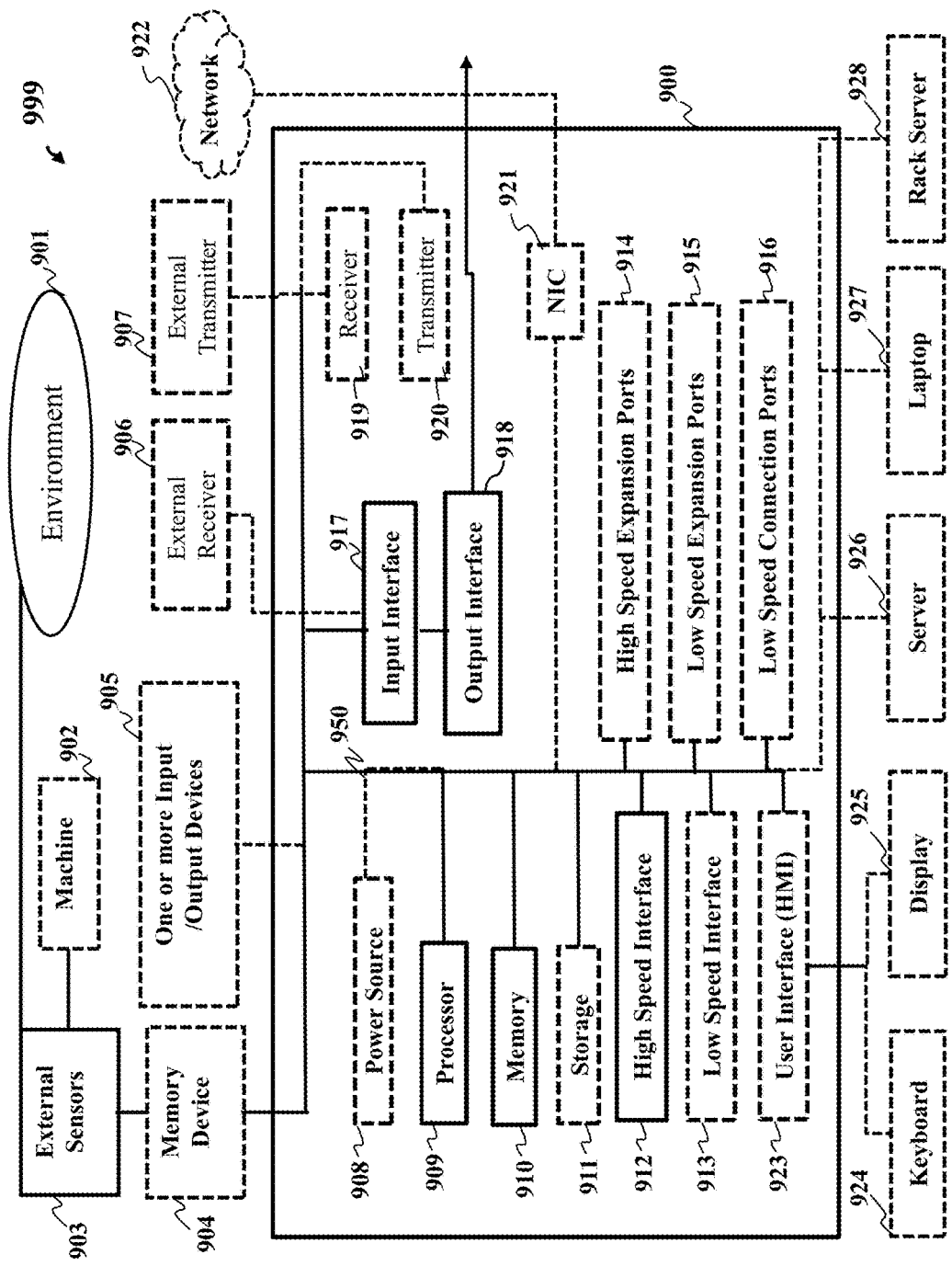
FIG. 9 is a schematic illustrating a computing apparatus that can be used to implement some techniques of the methods and systems, according to embodiments of the present disclosure.

FIG. 9 is a schematic illustrating by non-limiting example a computing system 999 that can be used to implement some techniques of the methods and systems, according to embodiments of the present disclosure. The computing system 999 can include a computing apparatus or device 900 represents various forms of digital computers, such as laptops, desktops, workstations, personal digital assistants, servers, blade servers, mainframes, and other appropriate computers.

The computing device 900 can include a power source 908, a processor 909, a memory 910, a storage device 911, all connected to a bus 950. Further, a high-speed interface 912, a low-speed interface 913, high-speed expansion ports 914 and low speed expansion ports 915, can be connected to the bus 950. Also, a low-speed connection port 916 is in connection with the bus 950. Contemplated are various component configurations that may be mounted on a common motherboard, by non-limiting example, 900, depending upon the specific application. Further still, an input interface 917 can be connected via bus 950 to an external receiver 906 and an output interface 918. A receiver 919 can be connected to an external transmitter 907 and a transmitter 920 via the bus 950. Also connected to the bus 950 can be an external memory 904, external sensors 903, machine(s) 902 and an environment 901. Further, one or more external input/output devices 905 can be connected to the bus 950. A network interface controller (NIC) 921 can be adapted to connect through the bus 950 to a network 922, wherein data or other data, among other things, can be rendered on a third-party display device, third party imaging device, and/or third party printing device outside of the computer device 900.

Contemplated is that the memory 910 can store instructions that are executable by the computer device 900, historical data, and any data that can be utilized by the methods and systems of the present disclosure. The memory 910 can include random access memory (RAM), read only memory (ROM), flash memory, or any other suitable memory systems. The memory 910 can be a volatile memory unit or units, and/or a non-volatile memory unit or units. The memory 910 may also be another form of computer-readable medium, such as a magnetic or optical disk.

Still referring to FIG. 9, a storage device 911 can be adapted to store supplementary data and/or software modules used by the computer device 900. For example, the storage device 911 can store historical data and other related data as mentioned above regarding the present disclosure. Additionally, or alternatively, the storage device 911 can store historical data similar to data as mentioned above regarding the present disclosure. The storage device 911 can include a hard drive, an optical drive, a thumb-drive, an array of drives, or any combinations thereof. Further, the storage device 911 can contain a computer-readable medium, such as a floppy disk device, a hard disk device, an optical disk device, or a tape device, a flash memory or other similar solid-state memory device, or an array of devices, including devices in a storage area network or other configurations. Instructions can be stored in an information carrier. The instructions, when executed by one or more processing devices (for example, processor 909), perform one or more methods, such as those described above.

The system can be linked through the bus 950 optionally to a display interface or user Interface (HMI) 923 adapted to connect the system to a display device 925 and keyboard 924, wherein the display device 925 can include a computer monitor, camera, television, projector, or mobile device, among others.

Still referring to FIG. 9, the computer device 900 can include a user input interface 917 adapted to a printer interface (not shown) can also be connected through bus 950 and adapted to connect to a printing device (not shown), wherein the printing device can include a liquid inkjet printer, solid ink printer, large-scale commercial printer, thermal printer, UV printer, or dye-sublimation printer, among others.

The high-speed interface 912 manages bandwidth-intensive operations for the computing device 900, while the low-speed interface 913 manages lower bandwidth-intensive operations. Such allocation of functions is an example only. In some implementations, the high-speed interface 912 can be coupled to the memory 910, a user interface (HMI) 923, and to a keyboard 924 and display 925 (e.g., through a graphics processor or accelerator), and to the high-speed expansion ports 914, which may accept various expansion cards (not shown) via bus 950. In the implementation, the low-speed interface 913 is coupled to the storage device 911 and the low-speed expansion port 915, via bus 950. The low-speed expansion port 915, which may include various communication ports (e.g., USB, Bluetooth, Ethernet, wireless Ethernet) may be coupled to one or more input/output devices 905, and other devices a keyboard 924, a pointing device (not shown), a scanner (not shown), or a networking device such as a switch or router, e.g., through a network adapter.

Still referring to FIG. 9, the computing device 900 may be implemented in a number of different forms, as shown in the figure. For example, it may be implemented as a standard server 926, or multiple times in a group of such servers. In addition, it may be implemented in a personal computer such as a laptop computer 927. It may also be implemented as part of a rack server system 928. Alternatively, components from the computing device 900 may be combined with other components in a mobile device, such as a mobile computing device. Each of such devices may contain one or more of the computing device 900 and the mobile computing device, and an entire system may be made up of multiple computing devices communicating with each other.

Figure 10:
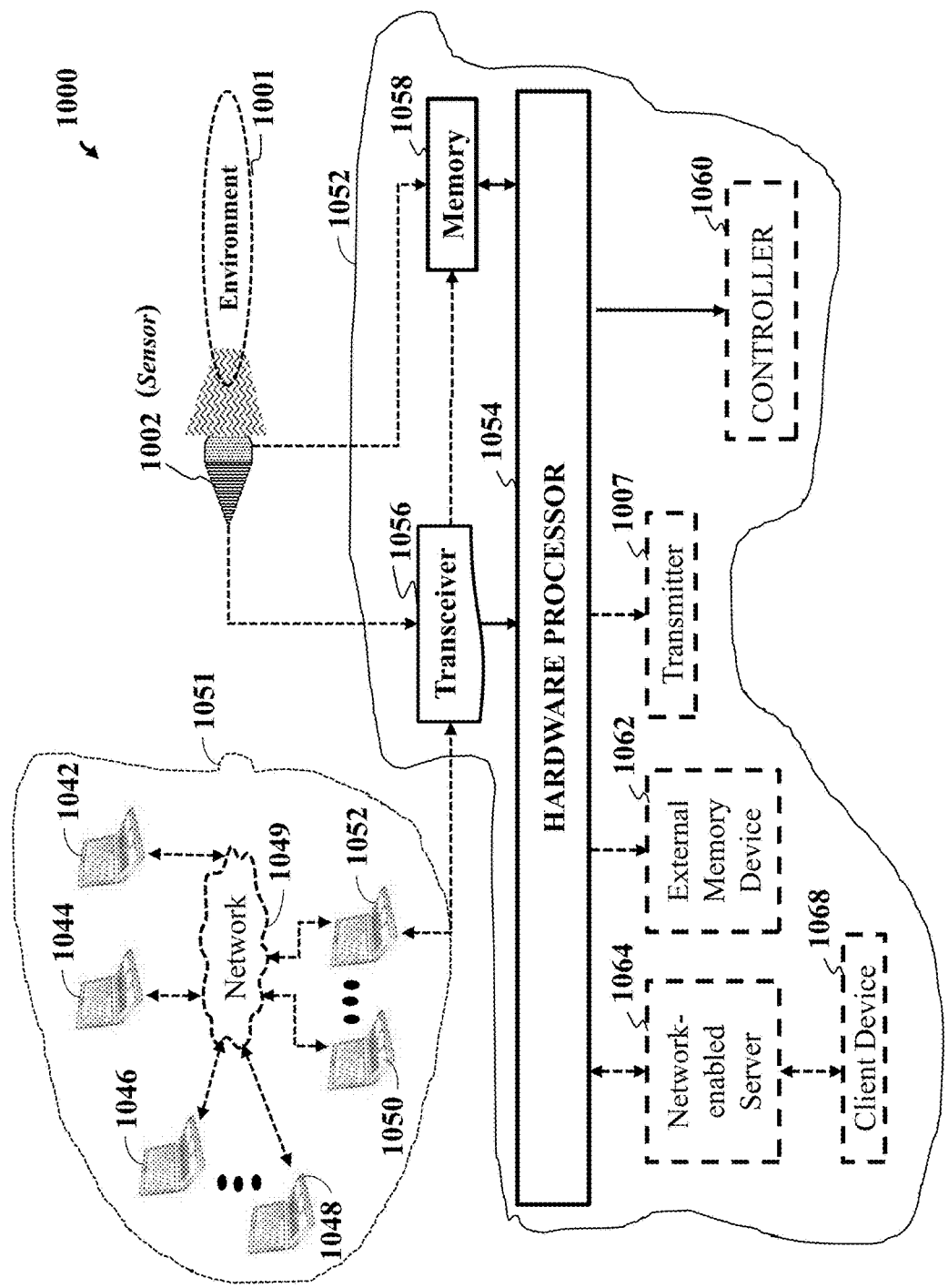
FIG. 10 is a block diagram illustrating some components that can be used for implementing the systems and methods, according to embodiments of the present disclosure.

FIG. 10 is a block diagram illustrating another computer system 1000 having some computing devices that can be used for implementing the systems and methods that includes a network overview, according to embodiments of the present disclosure. An example of a network for implementing a distribution control system (DCS) 1051 can include a central computer 1042, i.e. may be more than one central computer and a network 1049 communicatively connected to networked computers 1044, 1046, 1048, 1050 and 1052. The central computer 1042 can manage and operate the DCS 1051, and by non-limiting example, be associated with an operator that manages a power distribution system that serves or is served by electrical loads or resources associated with the networked computers 1044, 1046, 1048, 1050 and 1052. The central computer 1042 can be associated with one or more buses in an electric power system, one or more types of substations. Also, the network 1049 may by non-limiting example include computing hardware connected with an electrical device, a power generator, etc., wherein the computing hardware may include integrated circuits that are structured to perform the systems and method of the present disclosure. The central computer 1042 can receive real-time measurements from those computing devices associated with monitoring devices, such as intelligent electronics devices, and phase measurement units which can be computing devices 1046, 1048, and receive statuses or regulation settings from those computing devices associated with voltage regulation devices or switchable devices which can be computing devices 1044, 1050 and 1052. The operator or central computer 1042 can then send a request for collecting real-time measurements or statuses to the computing devices 1044, 1046, 1048, 1050 and 1052.

When the request is received, the required information is collected and sent back to the DCS for processing. For example, the central computer 1042 can use the data collected by the computing devices 1044, 1046, 1048, 1050 and 1052 to detect and locate a short circuit fault in a distribution feeder. The central computer 1042 can also have other data such as historical fault events that can be transmitted to the networked computers. Further, the central computer 1042 can be accessed over the network 1049, which can be used as a Local Area Network ("LAN") using wired networking (e.g., the Ethernet IEEE standard 802.3 or other appropriate standard) or wireless networking.

For example, as noted above, the DCS 1051 can use computing devices 1046, 1048, to generate a node attribute dataset based on during-fault voltage and current measurements when a request is received, for example, through a web site that transmits the DCS's requests over the Internet to the central computer 1042. In such instances, the requests can be computed and transmitted by executing computer-executable instructions stored in non-transitory computer-readable media (e.g., memory or storage). It is possible that the central computer 1042 can receive node attribute dataset from those computing devices associated with monitoring devices's 1046, 1048, and receive branch attribute dataset from those computing devices associated with branch regulation and energization data via computing devices 1044, 1050 and 1052.

Still referring to FIG. 10, a computing device 1052 (which can be a tap changer, or a switch controller), that includes a hardware processor 1054, in communication with a transceiver 1056. The transceiver 1056 can be in communication with a sensor 1002 or sensors, that collects data from an environment 1001 that is related to an area the electrical device operates. The sensor 1002 converts an input into a signal, which can be stored in memory 1058. The hardware processor 1054 in communication with a computer storage memory, i.e. memory 1058, such that the memory 1058 includes stored data, including algorithms, instructions and other data, that can be implemented by the hardware processor 1054. The computing device 1052 can further include a controller 1060, transmitter 1007, external memory device 1062, network-enabled server 1064 and a client device 1068.

It is contemplated the hardware processor 1054 can include two or more hardware processors depending upon the requirements of the specific application, wherein the processors can be either internal or external. Certainly, other components may be incorporated with method 1000 including output interfaces and transceivers, among other devices.

It is possible the network 1049 can include, by non-limiting example, one or more local area networks (LANs) and/or wide area networks (WANs). Wherein the networking environments can be similar to enterprise-wide computer networks, intranets and the Internet. Contemplated for all the components mentioned that there can be any number of client devices, storage components, and data sources employed within the system 1000. Each may comprise a single device or multiple devices cooperating in a distributed environment. Further, system 1000 can include one or more data source(s) (not shown). The data source(s) can comprise data resources for training neural networks to express fault location regression or classification functions. The data provided by data source(s) may include during-fault voltage and current measurements, pre-fault branch regulation and energization data, and verified fault types and locations for historical short circuit events.

The present disclosure improves the existing technology and technological field, for example the fields of power distribution system management and control using the intelligent controllers controlled based on the fault detection results fed by the DCS. For example, the computing hardware is activating and deactivating the electrical device, such as a feeder breaker based on a command made by the DCS when a fault location is determined. Specifically, that the components of the systems and methods of the present disclosure are meaningfully applied to improve the control of switchable devices using the computing devices associated with the devices, which in turn, improves the power distribution system management. Further, the steps of the systems and methods of the present disclosure are by computing hardware associated with the electrical device.

Features

An aspect can include the node attributes include measured phase to ground voltages that include magnitude and angle measurements, and measured injection currents that include magnitude and angle measurements. Another aspect is the fault detection apparatus is configured to measure in real-time pre-fault branch regulations and energizations, and time-synchronized node voltages and currents during a fault, and magnitudes and angles, either at a start terminal of the primary feeder, at an end terminal of a primary feeder, and at a low voltage side of distribution transformers associated with the distribution feeder, obtained from sensors associated with the distribution feeder Another aspect is that the node attributes include measured phase to phase voltages and zero-sequence voltages that both include magnitude and angle measurements, and measured injection currents that include magnitude and angle measurements.

Still another aspect is the branch attributes include at least partial of equivalent nodal conductance and susceptance matrices corresponding to nodes separated by the branch. Wherein equivalent nodal conductance and susceptance matrices for a distribution line is determined according to a series impedance matrix and a shunt admittance matrix for the line. Wherein equivalent nodal conductance and susceptance matrices for a distribution transformer is determined according to transformer ratios, series impedances and winding connection for the transformer line. Wherein equivalent nodal conductance and susceptance matrices for a branch combined a voltage regulator with a downstream distribution line is determined according to a set of regulation ratios and winding connections of the regulator and a series impedance matrix and a shunt admittance matrix of the distribution line. Wherein equivalent nodal conductance and susceptance matrices for a branch combined a switch with a downstream distribution line is determined according to a set of energized statuses for all phases of the switch and a series impedance matrix and a shunt admittance matrix of the distribution line.

Another aspect can be the POE characteristics include node data including typical load demand profiles and phase connections of power loads connected to the node, typical generation profiles and phase connection of distribution generations connected to the node, and capacitor capacities and phase connections of shunt capacitors connected to the node.

Still further, an aspect can be the POE characteristics include branch data including a series impedance matrix and a shunt admittance matrix for a distribution branch; a set of parameters for a transformer, including transformer ratios, series impedances and winding connection; a set of parameters for a voltage regulator, including regulation ratios and winding connection; and a set of phase energized statuses for a switch. Another aspect is that the received measured voltage and current raw data from the nodes is recorded with an intelligent electronic device (IED), or a physical phasor measurement unit (PMU). Still another aspect is the received real-time measured regulation and energization raw data from the branches is recorded with a tap changer for a regulator or a controller for a switch.

An aspect is that the fault detection neural network is trained using a set of fault scenarios generating by simulating a set of pre-determined fault conditions on each branch of all the branches of the distribution feeder separately, wherein the fault condition includes a fault type, a relative fault location along the branch, an impedance at fault location, a pre-fault load demand level and a pre-fault generation level. Further composing obtaining a dataset of node attributes, a dataset of branch attributes, and a set of output attributes for each simulated fault scenario. Wherein output attributes include data to identify nodes separated by the branch having a fault, relative distances between fault location and the nodes of the fault branch, and a set of fault phases of the fault branch. Wherein, the fault type includes a single phase to ground fault, a double phase to ground fault, a phase to phase fault, a triple phase to ground fault, and a phase to phase to phase fault.

Another aspect is the fault detection neural network is a graph neural network, wherein the graph neural network includes a series of graph processing layers for aggregating node and branch attributes into hidden node embeddings, and a series of full-connected prediction layers for estimating fault location according to graph hidden node embeddings. Wherein the first graph processing layer sets node embeddings with node attributes, and the successive graph processing layer calculates its node embeddings as an activated sum of combination of weighted node embeddings at previous layer and weighted sum of neighborhood impacts. Wherein neighborhood impacts for each neighbor is calculated as a decayed combination of neighbor embeddings and weighted branch attributes for the branch connected to neighbor node; wherein a decay factor is calculated as an activated sum of weighted node embeddings, weighted branch attributes, weighted neighbor embeddings and an addition of biases.

Still another aspect is that sum of neighborhood impacts is approximated as expected neighborhood impacts of a fixed number of neighbor samples; wherein sampling probability is approximated according to a norm of the combination of neighbor embeddings and weighted branch attributes. Wherein each predicting layer calculates its output features as an activated sum of weighted inputs from previous layer with an addition of biases; wherein the inputs of first predicting layer are the calculated node embeddings of last graph processing layer. Wherein the output features of last predicting layer are data relating to the fault location. Wherein the summed neighborhood embeddings are estimated by sampling a fixed number of neighbors and approximated as expectations of neighborhood embeddings for samples with sampling probability defined according to a norm of each neighborhood embeddings.

Some embodiments of the present disclosure include a GNN model that is an extension of a conventional graph convolutional network (GCN). The GNN of the present disclosure models a more complete set of factors and parameters that may affect the fault behaviors, and then improves the accuracy of fault detection and location, when compared to conventional GCNs. The conventional GCNs are based on conventional Convolutional Neural Networks (CNNs). The CNNs are Deep Learning algorithms which can take in an input image, assign importance (learnable weights and biases) to various aspects/objects in the image and be able to differentiate one from the other. Whereas the conventional Graph Convolutional Networks (GCNs) are of a type of convolutional neural network (CNN), as noted above, that can work directly on graphs and take advantage of their structural information. The conventional GCNs used for detecting faults and fault locations, are specifically for detecting faults at bus locations, due to the conventional GCNs capability in aggregating local neighborhood information for individual graph nodes. These conventional GCNs leverage low-rank proximities and node features of the graph, however, what is ignored are attributes that graph links may carry, all of these conventional GCNs models simplify graph links into binary or scalar values describing node connectedness to identify neighborships and their influence if weighted in the local neighborhoods, at the bus locations.

Definitions

Short circuit fault: can be an electrical circuit that allows a current to travel along an unintended path with no or very low electrical impedance. This results in an excessive current flowing through the circuit. It is an unavoidable fact that distribution systems are subject to various types of short circuit faults along distribution feeders. Permanent faults cause relay actions that open breakers and de-energize the area surrounding the faulted section of the feeder.

Feeder: The electric distribution feeders can by-non-limiting example, have voltage regulator, an in-line transformer, overhead distribution lines and underground cables of various configurations, several unbalanced spot and distributed loads, and shunt capacitor banks. Also, the feeder have three-phase, double-phase, and single-phase laterals.

Event: is considered some action that caused damage to at least a portion of the power grid, resulting in a potential of, a destabilization of or loss of, power in the power distribution network, which causes an interruption of suppling continuous power either immediately or sometime in a near future. Some examples of events may be considered as natural disaster event (weather, earthquake, etc.), an intentional damaging event (terrorist attack, etc.) or an unintentional damaging event (fallen trees, plane crash, train wreck, etc.).

Power disruption: Can be a power outage or power failures in the power distribution network. Examples of some causes of power failures can include faults at power stations, damage to electric transmission lines, substations or other parts of the distribution system, a short circuit, or the overloading of electricity mains. Specifically, a power outage can be a short or long-term state of electric power loss in a given area or section of a power grid, that could affect a single house, building or an entire city, depending on the extent of the damage or cause of the outage.

Power loads: can be an electrical load is an electrical component or portion of a circuit that consumes (active) electric power. This is opposed to a power source, such as a battery or generator, which produces power. In electric power circuits examples of loads are appliances and lights. Loads may be further classified as critical loads and non-critical loads.

Condition information: from devices may include device energized status, device damage/disconnected status, terminal voltages, and power flows. For example, a current condition information received from the devices can be updated condition information for that moment in time the condition information is received or obtained.

Power distribution grid data: Can include a topology of the power distribution grid, locations of loads and sources, typical profiles for loads and generations, along with labeling the one or more loads as the subset of critical loads and the subset of non-critical loads.

Embodiments

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements. Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks. Various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine. Typically, the functionality of the program modules may be combined or distributed as desired in various embodiments.

Embodiments of the present disclosure may be embodied as a method, of which an example has been provided. The acts performed as part of the method may be ordered in any suitable way. Accordingly, embodiments may be constructed in which acts are performed in an order different than illustrated, which may include performing some acts concurrently, even though shown as sequential acts in illustrative embodiments. Further, use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

What is claimed is:

1. A method performed by a fault detection apparatus for fault detection and localization in distribution feeders having branches and nodes, comprising:
receiving feeder raw data in a distribution feeder of a power distribution system;
processing the feeder raw data with predetermined operational electrical characteristics of the distribution feeder to generate a branch attribute dataset for each branch separated by a pair of nodes for all branches, and generate a node attribute dataset for each node for all the nodes in the distribution feeder;
inputting the branch attribute datasets and the node attribute datasets into a trained fault detection neural network to determine whether a branch has a fault and a fault location within the branch, to output a classification of the fault and the fault location, and generate an alert signal based upon determining the classified fault and the fault location; and
sending the alert signal to an alert control system, upon the alert signal being received, generate an action in response to the alert signal to an outage response system.

2. The method of claim 1, wherein the fault detection apparatus is configured to measure in real-time pre-fault branch regulations and energizations, and time-synchronized node voltages and currents during a fault, and magnitudes and angles, obtained from sensors associated with the distribution feeder.

3. The method of claim 1, wherein the branch attribute dataset for each branch is generated from real-time measured pre-fault regulations and energizations branch raw data, and the node attribute dataset for each node that is generated from real-time measured during-fault voltages and currents node raw data, via the feeder raw data.

4. The method of claim 1, wherein the branch attributes include at least partial of equivalent nodal conductance and susceptance matrices corresponding to nodes separated by the branch.

5. The method of claim 4, wherein equivalent nodal conductance and susceptance matrices for a distribution line is determined according to a series impedance matrix and a shunt admittance matrix for the line.

6. The method of claim 4, wherein equivalent nodal conductance and susceptance matrices for a distribution transformer is determined according to transformer ratios, series impedances and winding connection for the transformer line.

7. The method of claim 4, wherein equivalent nodal conductance and susceptance matrices for a branch combined a voltage regulator with a downstream distribution line is determined according to a set of regulation ratios and winding connection of the regulator and a series impedance matrix and a shunt admittance matrix of the distribution line.

8. The method of claim 4, wherein equivalent nodal conductance and susceptance matrices for a branch combined a switch with a downstream distribution line is determined according to a set of energized statuses for all phases of the switch and a series impedance matrix and a shunt admittance matrix of the distribution line.

9. The method of claim 1, wherein the node attributes include measured phase to phase voltages and zero-sequence voltages that both include magnitude and angle measurements, and measured injection currents that include magnitude and angle measurements, and the branch attributes include at least partial of equivalent nodal conductance and susceptance matrices corresponding to nodes separated by the branch.

10. The method of claim 1, wherein the predetermined operational electrical characteristics of the distribution feeder include: node standard operation data including load demand profiles and phase connections of power loads connected to nodes; standard operational generation profiles and phase connection of distributed generations connected to nodes; and capacitor capacities and phase connections of shunt capacitors connected to nodes.

11. The method of claim 1, wherein the predetermined operational electrical characteristics of the distribution feeder include: branch data including a series impedance matrix and a shunt admittance matrix for a distribution branch; a set of parameters for each transformer, including transformer ratios, series impedances and winding connection; a set of parameters for each voltage regulator, including regulation ratios and winding connection; and a set of phase energized statues for switches.

12. The method of claim 1, wherein the trained fault detection neural network is trained using a set of fault scenarios generated by simulating a set of pre-determined fault conditions on each branch of all the branches of the distribution feeder separately, and wherein the fault condition includes a fault type, a relative fault location along the branch, an impedance at the fault location, a pre-fault load demand level and a pre-fault generation level.

13. The method of claim 12, further including: obtaining a dataset of node attributes, a dataset of branch attributes, and a set of output attributes for each simulated fault scenario, and wherein output attributes include data to identify nodes separated by the branch having a fault, relative distances between the fault location and the nodes of the fault branch, and a set of fault phases of the fault branch.

14. The method of claim 12, wherein the fault type includes a single phase to ground fault, a double phase to ground fault, a phase to phase fault, a triple phase to ground fault, and a phase to phase to phase fault.

15. The method of claim 1, wherein the trained fault detection neural network is a graph neural network, such that the graph neural network includes a series of graph processing layers for aggregating node and branch attributes into node embeddings, and a series of full-connected prediction layers for estimating fault location according to graph node embeddings.

16. The method of claim 15, wherein a first graph processing layer of the series of graph processing layers, sets node embeddings with node attributes, and the successive graph processing layer calculates its hidden node embeddings as an activated sum of combination of weighted node embeddings at a previous layer and weighted sum of neighborhood impacts, wherein neighborhood impacts for each neighbor is calculated as a decayed combination of neighbor embeddings and weighted branch attributes for the branch connected to neighbor node, and wherein a decay factor is calculated as an activated sum of weighted node embeddings, weighted branch attributes, weighted neighbor embeddings and an addition of biases.

17. The method of claim 16, wherein a sum of neighborhood impacts is approximated as expected neighborhood impacts of a fixed number of neighbor samples, and wherein a sampling probability is approximated according to a norm of the combination of neighbor embeddings and weighted branch attributes.

18. The method of claim 16, wherein each predicting layer calculates its output features as an activated sum of weighted inputs from a previous layer with an addition of biases, wherein the inputs of first predicting layer are the calculated node embeddings of last graph processing layer, and wherein the output features of last predicting layer are data relating to the fault location.

19. The method of claim 16, wherein the summed neighborhood embeddings are estimated by sampling a fixed number of neighbors and approximated as expectations of neighborhood embeddings for samples with sampling probability defined according to a norm of each neighborhood embeddings.

20. The method of claim 1, wherein the received feeder raw data includes real-time measured voltage and current raw data from the nodes that is recorded with a physical intelligent electronic device (IED) or physical phasor measurement unit (PMU).

21. The method of claim 1, wherein the received feeder raw data includes real-time measured regulation and energization raw data from the branches that is recorded with a controller for a switch, or a tap changer for a voltage regulator.

22. A fault detection apparatus for fault detection and localization in distribution feeders having branches and nodes, comprising:
 a computing system having, a transceiver, data storage with instructional modules and circuitry configured for processing, to cause the apparatus to
 receive, via the transceiver, feeder raw data in a distribution feeder of a power distribution system;
 process, via the processor, the feeder raw data with predetermined operational electrical characteristics of the distribution feeder data accessed via the data storage, to generate a branch attribute dataset for each branch separated by a pair of nodes for all branches, and generate a node attribute dataset for each node for all the nodes in the distribution feeder;
 input the branch attribute datasets and the node attribute datasets into a trained fault detection neural network to determine whether a branch has a fault and a fault location within the branch, to output a classification of the fault and the fault location, and generate an alert signal based upon determining the classified fault and the fault location; and
 send, via the transceiver, the alert signal to an alert control system, upon the alert signal being received, the alert control system generates an action in response to the alert signal to an outage response system to reroute power and restore service to the disconnected power of the distribution feeder with the fault.

23. A non-transitory computer readable medium, having a computer program thereon, wherein the computer program, when executed by a processor of a fault detection apparatus, causes the processor to:
 receive feeder raw data including real-time measured pre-fault branch regulations and energizations data, and real-time measured during-fault node voltages and currents raw data, in a distribution feeder of a power distribution system;
 process the feeder raw data with predetermined operational electrical characteristics of the distribution feeder to generate a branch attribute dataset for each branch separated by a pair of nodes for all branches, and generate a node attribute dataset for each node for all the nodes in the distribution feeder;
 input the branch attribute datasets and the node attribute datasets into a trained fault detection neural network to determine whether a branch has a fault and a fault location within the branch, to output a classification of the fault and the fault location, and generate an alert signal based upon determining the classified fault and the fault location; and
 reroute power and restore service to the disconnected power of the distribution feeder with the fault, based upon the alert signal being sent to, and received by, an outage response system.

* * * * *